United States Patent
Bartoli et al.

(10) Patent No.: US 9,680,117 B2
(45) Date of Patent: Jun. 13, 2017

(54) THIN FILM SMALL MOLECULE ORGANIC PHOTOVOLTAIC SOLAR CELL

(71) Applicant: Lehigh University, Bethlehem, PA (US)

(72) Inventors: Filbert Joseph Bartoli, Center Valley, PA (US); Beibei Zeng, Bethlehem, PA (US)

(73) Assignee: LEHIGH UNIVERSITY

(*) Notice: Subject to any disclaimer, the term of this patent is extended or adjusted under 35 U.S.C. 154(b) by 0 days.

(21) Appl. No.: 14/781,778

(22) PCT Filed: Apr. 3, 2014

(86) PCT No.: PCT/US2014/032809
§ 371 (c)(1),
(2) Date: Oct. 1, 2015

(87) PCT Pub. No.: WO2014/165666
PCT Pub. Date: Oct. 9, 2014

(65) Prior Publication Data
US 2016/0049606 A1 Feb. 18, 2016

Related U.S. Application Data

(60) Provisional application No. 61/808,407, filed on Apr. 4, 2013.

(51) Int. Cl.
*H01L 51/44* (2006.01)
*H01L 51/42* (2006.01)
(Continued)

(52) U.S. Cl.
CPC .......... *H01L 51/447* (2013.01); *H01L 51/424* (2013.01); *H01L 51/442* (2013.01);
(Continued)

(58) Field of Classification Search
CPC ...... H01L 51/42–51/448; H01L 31/054; H01L 31/056
See application file for complete search history.

(56) References Cited

U.S. PATENT DOCUMENTS 5,272,356 A * 12/1993 Wen ................. H01L 27/146
257/184
2007/0019292 A1 1/2007 Kim et al.
(Continued)

OTHER PUBLICATIONS

Zeng, Beibei, et al. "Absorption enhancement in thin-film organic photovoltaics with double plasmonic structures." IEEE Photonic Society 24th Annual Meeting. 2011.*
(Continued)

*Primary Examiner* — Allison Bourke
*Assistant Examiner* — William E McClain
(74) *Attorney, Agent, or Firm* — The Belles Group, P.C.

(57) ABSTRACT

A thin film organic photovoltaic device or solar cell in one embodiment includes an organic active bilayer and an ultra-thin two-dimensional metallic nanogrid as a transparent conducting electrode which receives incident light. The nanogrid excites surface plasmonic resonances at an interface between the nanogrid and active bilayer from the incident light to enhance photon absorption in the active bilayer below the nanogrid. In another embodiment, spatially separated nanograting electrodes may alternatively be formed by double one-dimensional nanogratings disposed on opposite sides of the organic active bilayer. The spatially separated nanogratings may be oriented perpendicular to each other.

10 Claims, 18 Drawing Sheets

(51) Int. Cl.
*H01L 31/054* (2014.01)
*H01L 51/00* (2006.01)

(52) U.S. Cl.
CPC .......... *H01L 51/445* (2013.01); *H01L 31/054* (2014.12); *H01L 51/0037* (2013.01); *H01L 51/0053* (2013.01); *H01L 51/0091* (2013.01); *H01L 2251/301* (2013.01); *Y02E 10/549* (2013.01)

(56) References Cited

U.S. PATENT DOCUMENTS

2010/0116312 A1    5/2010  Peumans et al.
2011/0285942 A1  11/2011  Guo et al.
2013/0037109 A1    2/2013  Park et al.

OTHER PUBLICATIONS

Lee, et al. "Analysis and optimization of surface plasmon-enhanced organic solar cells with a metallic crossed grating electrode." Optics express 20.105 (2012): A740-A753.*
Shen, et al. "Combined plasmonic gratings in organic solar cells." Optics express 19.106 (2011): A1202-A1210.*
Popov, et al. "Total absorption of unpolarized light by crossed gratings." Optics express 16.9 (2008): 6146-6155.*
Zilio, et al. "Light absorption enhancement in heterostructure organic solar cells through the integration of 1-D plasmonic gratings." Optics express 20.104 (2012): A476-A488.*
Corresponding International Search Report for PCT/US2014/032809 dated Aug. 20, 2014.

\* cited by examiner

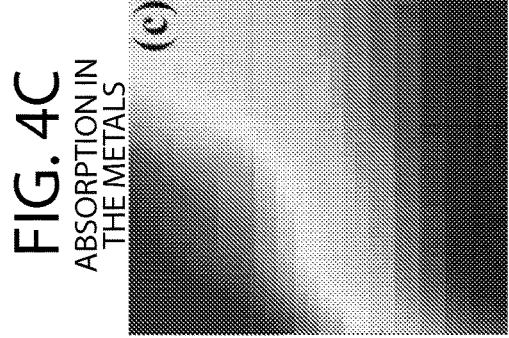
FIG. 4A ABSORPTION OF THE OPV DEVICE
FIG. 4B ABSORPTION IN THE ACTIVE LAYERS
FIG. 4C ABSORPTION IN THE METALS
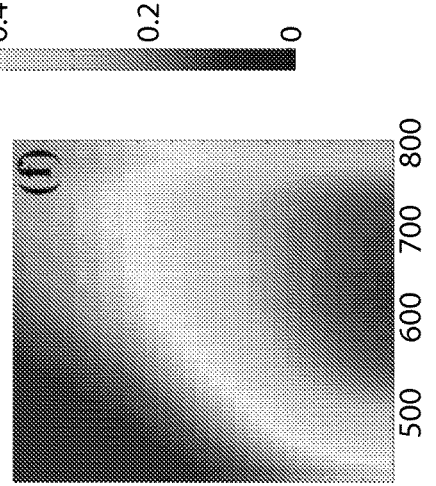
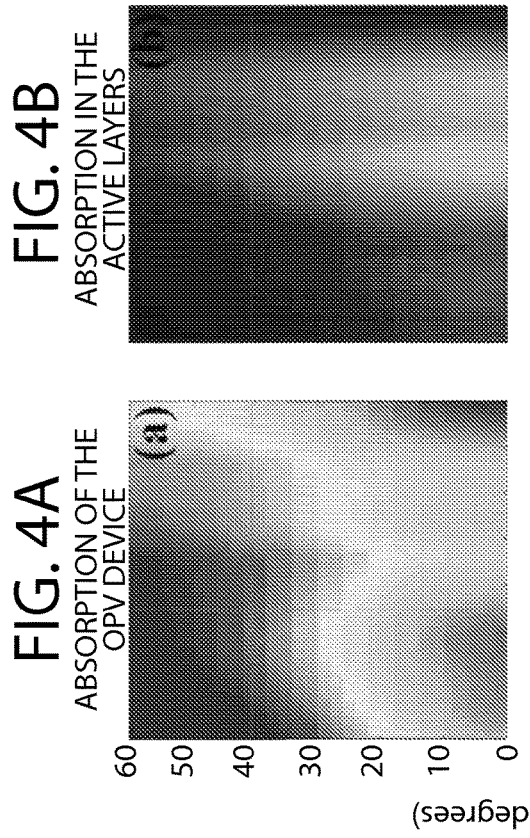
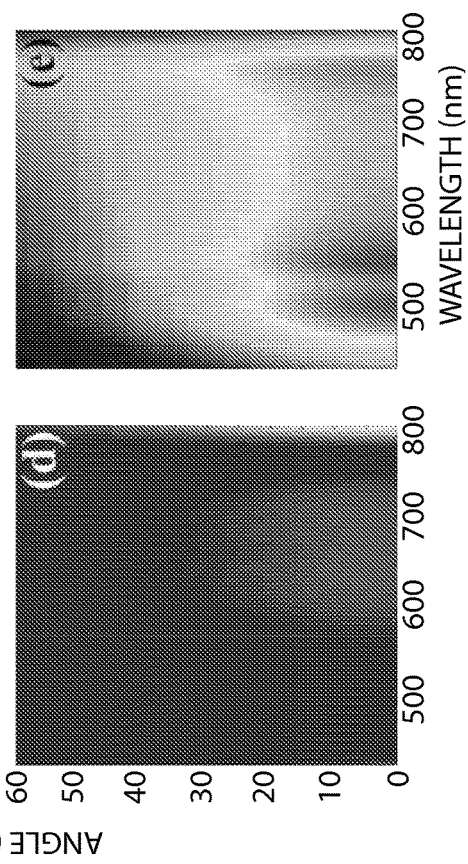
FIG. 4D
FIG. 4E
FIG. 4F 2D Ag NANOGRATING DOUBLE 1D Ag NANOGRATING

THIN FILM SMALL MOLECULE ORGANIC PHOTOVOLTAIC SOLAR CELL

CROSS-REFERENCE TO RELATED APPLICATIONS

The present application is a U.S. national stage application under 35 U.S.C. §371 of PCT/US2014/032809 filed Apr. 3, 2014, which claims the benefit of U.S. Provisional Patent Application Ser. No. 61/808,407 filed Apr. 4, 2013, which are incorporated herein by reference in their entireties.

STATEMENT OF GOVERNMENT INTEREST

This invention was made with government support under ECCS 0901324 and CBET 1014957 awarded by National Science Foundation (NSF). The government has certain rights in the invention.

BACKGROUND OF THE INVENTION

The present invention relates to photovoltaic (PV) devices, and more particularly to a thin film molecular organic photovoltaic (OPV) device or solar cell.

Photovoltaic devices or solar cells have the potential to provide an unlimited source of energy by converting solar energy into electricity. Low-cost, lightweight and mechanically resilient solar power sources are of increasing interest for modern applications such as electronic textiles, synthetic skin and robotics. Compared with the inorganic photovoltaics, the primary benefits of organic photovoltaics (OPVs) are often listed as low-cost, low-weight, flexibility and compatibility with reel-to-reel processing for high volume production. However, due to the poor generation and extraction of electric charges, the power conversion efficiency (PCE) of OPVs is limited. The latest record of PCE is about 10.6% for OPVs, which is still much lower than that of inorganic solar cells. The relatively poor performance of OPVs originates from the low charge carrier mobility and small exciton diffusion length (~10 nm) in organic semiconductor materials, which limit the thickness of active layers in OPVs, resulting in poor absorption of incident solar photons. It is a fundamental issue in OPVs to achieve efficient optical absorption for organic active layers much thinner than the optical absorption length. Therefore, in order to optimize both optical and electrical properties of OPVs simultaneously, light trapping strategies must be used to achieve high optical absorption in the ultrathin organic active layers.

On the other hand, transparent conducting electrodes (TCEs) are essential components in many optoelectronic devices, including LEDs, electronic displays, and photovoltaics. Most OPVs employ an indium tin oxide (ITO) electrode due to ITO offers transparency at visible and near-IR frequencies as well as good electrical conductivity. However, ITO electrodes are not the optimum choice for OPVs and suffer from several drawbacks, such as collateral damage to the underlying organic materials, poor mechanical stability, and the band structure of ITO can hinder efficient photocurrent generation. In addition, the limited source of indium and the increasing demand for ITO from the rapidly growing visual display market have drastically increased the cost of ITO, highlighting a growing need for an alternative low-cost TCE for OPVs.

An improved OPV solar cell is therefore desired.

SUMMARY OF THE INVENTION

The present disclosure provides a thin-film molecular organic photovoltaic (OPV) solar cell with optical absorption improvement over prior designs. In one embodiment, an ultrathin two-dimensional (2D) metallic nanogrid is employed as the transparent conducting electrode (TCE) to replace the conventional ITO electrode. The nanogrid may be silver (Ag) in one non-limiting example. A spectrally broadband and polarization-insensitive absorption enhancement in the organic active layers can be achieved due to the excitation of surface plasmon resonances and plasmonic cavity modes. The total photon absorptivity can reach 0.495 in the organic active layers under standard air mass 1.5 (AM 1.5) solar illumination, representing an enhancement of 150%, which are believed to be record high values for such OPV architecture to the best of the inventors' knowledge. The OPV device with the Ag nanogrid/active layers/Ag film plasmonic cavity functions as a perfect light absorber with high absorption over the entire bandwidth (400~800 nm) up to 60° of the incident angle, in which the total photon absorptivity and its enhancement in active layers are found to be as much as 0.152 and 30.6%, respectively, under 60° light incidence.

According to an alternative embodiment, a spatially separated nanograting may alternatively be formed by ultrathin one-dimensional (1D) nanogratings disposed on opposite sides of the organic active bilayer. The top and bottom nanogratings may be oriented perpendicular to each other. The total photon absorption in organic active layers can further reach up to 0.595 with optimized double perpendicular 1D Ag nanogratings, representing an enhancement of 200%.

In one embodiment, a thin film organic photovoltaic solar cell includes: a bottom electrode layer; an electron transport layer disposed thereon which transports electrons to the bottom electrode layer; an organic active bilayer disposed thereon comprising an acceptor layer and a donor layer, the acceptor and donor layers being formed of electrically conductive organic polymers selected to form a heterojunction at an interface between the acceptor and donor layers; and a top plasmonic transparent conducting electrode layer disposed thereon, the plasmonic transparent electrode layer comprising a transparent conductive material and a two-dimensional ultrathin metallic nanogrid embedded therein. The nanogrid has a thickness and other geometric parameters selected to excite surface plasmonic resonances at an interface between the nanogrid and active bilayer, when light is incident on the plasmonic transparent conducting electrode layer, and to increase photon absorption in the active bilayer.

In another embodiment, a thin film organic photovoltaic solar cell includes: a bottom electrode layer; an electron transport layer disposed thereon and including a one-dimensional metallic bottom nanograting embedded therein; an organic active bilayer disposed thereon comprising an acceptor layer and a donor layer, the acceptor and donor layers being formed of electrically conductive organic polymers selected to form a heterojunction at an interface between the acceptor and donor layers; and a transparent top conducting electrode layer disposed thereon, the top electrode layer comprising a transparent conductive material and a one-dimensional metallic top nanograting embedded therein. The top and bottom nanogratings have thicknesses and other geometric parameters selected to excite surface plasmonic resonances at interfaces between the nanogratings and active bilayer for increasing photon absorption in the active bilayer.

In one embodiment, a thin film organic photovoltaic device includes: a bottom electrode layer; an electron transport layer disposed thereon and including a one-dimensional metallic bottom nanograting embedded therein, the bottom nanograting formed of a first array of parallel linear elements; an organic active bilayer disposed thereon comprising an acceptor layer and a donor layer, the acceptor and donor layers being formed of electrically conductive organic polymers selected to form a heterojunction at an interface between the acceptor and donor layers; and a transparent top conducting electrode layer disposed thereon, the top electrode layer comprising a transparent conductive material and a one-dimensional metallic top nanograting embedded therein, the top nanograting formed of a second array of parallel linear elements oriented perpendicular to the linear elements of the first array. The nanogratings have geometric parameters selected to excite surface plasmonic resonances at interfaces between the nanogratings and active bilayer for increasing photon absorption in the active bilayer.

A method for fabricating a thin film OPV solar cell is provided. In one embodiment, the method includes: forming an ultrathin conductive metallic 1D top nanograting on a transparent top substrate; depositing a transparent conductive material thereon, the top nanograting and transparent conductive material collectively forming a transparent conducting electrode; depositing an organic donor layer thereon; depositing an organic acceptor layer thereon, the donor and acceptor layers collectively forming an active organic bilayer; depositing an electron transport layer thereon; patterning the electron transport layer to form a negative pattern for forming an ultrathin conductive metallic 1D bottom nanograting; depositing a conductive metallic material in the negative pattern to form the bottom nanograting; and depositing a conductive bottom electrode layer thereon. In one embodiment, the bottom nanograting and bottom electrode layer may be formed in a single material deposition step both being formed of the same conductive metallic material.

Another method for fabricating a thin film OPV solar cell is provided. In one embodiment, the method includes: forming an ultrathin conductive metallic 2D top nanogrid on a transparent top substrate; depositing a transparent conductive material thereon, the top nanogrid and transparent conductive material collectively forming a transparent conducting electrode; depositing an organic donor layer thereon; depositing an organic acceptor layer thereon, the donor and acceptor layers collectively forming an active organic bilayer; depositing an electron transport layer thereon; and depositing a conductive bottom electrode layer thereon.

BRIEF DESCRIPTION OF THE DRAWINGS

The features of the exemplary embodiments of the present invention will be described with reference to the following drawings, where like elements are labeled similarly, and in which:

(FIG. 3B) linewidth w, when the thickness $t_1$ is fixed at 30 nm. All other parameters are the same as in FIG. 1A.

FIG. 4 shows the angle dependence of the optical absorption of (a) and (d) the whole OPV solar cell device; (b) and (e) the absorption in the active layers; and (c) and (f) the absorption in the metals, with (a-c) conventional ITO electrode and (d-f) 2D Ag nanogrids, respectively.

Figure 1A:
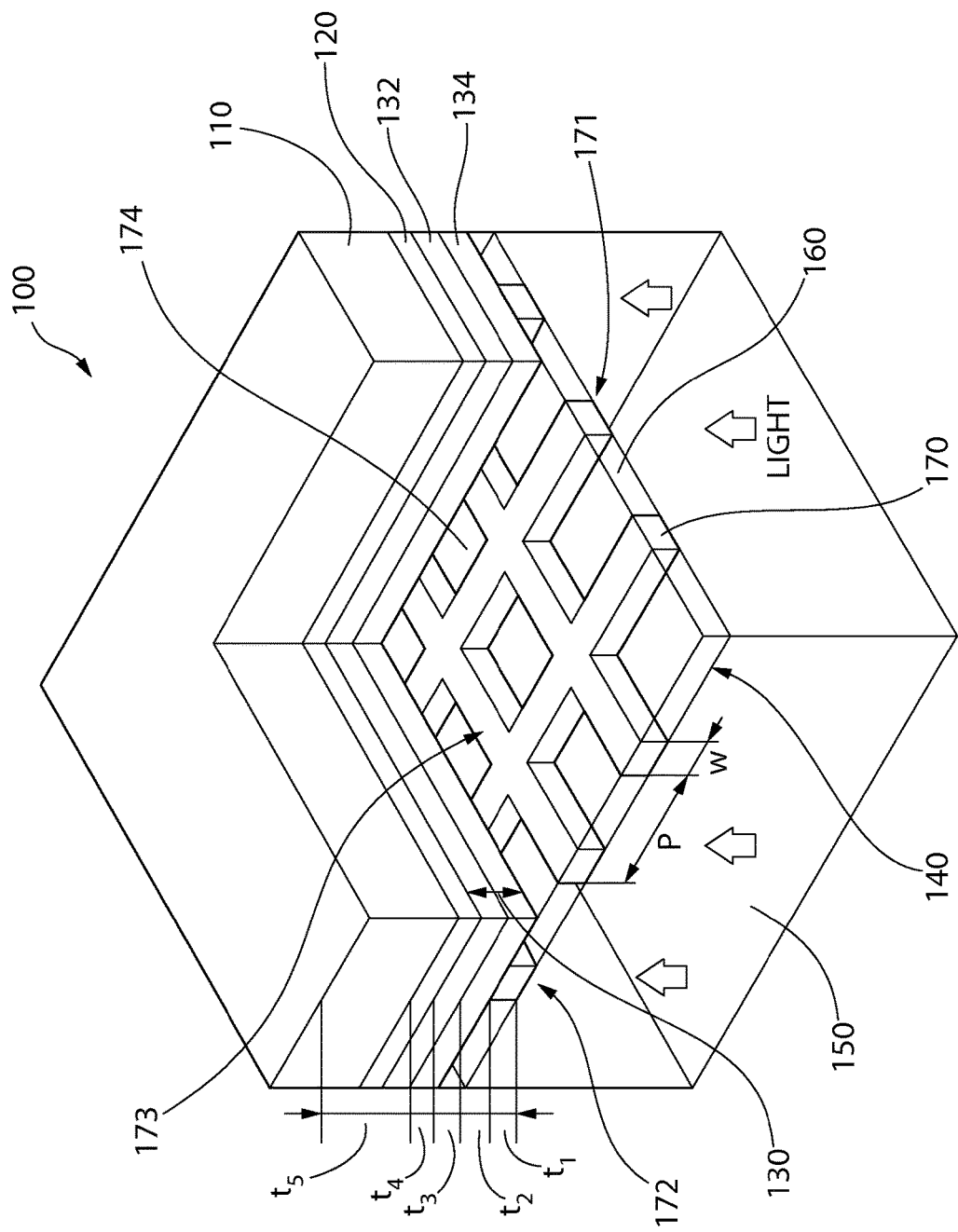
FIG. 1A is a transverse cross sectional view of a thin film small molecular organic photovoltaic (OPV) device or solar cell according to the present disclosure having a two-dimensional (2D) plasmonic nanogrid.

All drawings are schematic and not necessarily to scale. Parts given a reference numerical designation in one figure may be considered to be the same parts where they appear in other figures without a numerical designation for brevity unless specifically labeled with a different part number and described herein.

DETAILED DESCRIPTION OF THE EMBODIMENTS

The features and benefits of the invention are illustrated and described herein by reference to exemplary embodiments. This description of exemplary embodiments is intended to be read in connection with the accompanying drawings, which are to be considered part of the entire written description. Accordingly, the disclosure expressly should not be limited to such exemplary embodiments illustrating some possible non-limiting combination of features that may exist alone or in other combinations of features.

In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

As used throughout, ranges are used as shorthand for describing each and every value that is within the range. Any value within the range can be selected as the terminus of the range. In addition, all references cited herein are hereby incorporated by reference in their entireties. In the event of a conflict in a definition in the present disclosure and that of a cited reference, the present disclosure controls.

Recently, many new materials and geometries have been proposed as alternatives to ITO transparent conducting electrodes (TCEs) in organic photovolatics (OPVs), such as macroscopic metallic grids or gratings, random Ag nanowires, randomly perforated ultrathin metal films, carbon nanotube networks and graphene. In addition, a theoretical analysis of the light transmission through one-dimensional (1D) and two-dimensional (2D) metallic nanogratings has shown that metallic nanogratings with high aspect ratio could simultaneously have high optical transmission and good electrical conductivity, which are even better than that of ITO. Meanwhile, it would be very attractive if the metallic nanogratings used as TCEs were able to enhance the optical absorption in OPVs. In fact, 1D and 2D metallic nanogratings could excite surface plasmon resonances (SPRs) at the metal-dielectric interface, and lead to the highly confined and enhanced electromagnetic field at the interface, which can be naturally applied to increase the optical absorption in the ultrathin active layers close to the nanogratings and produce higher PCEs.

In previous studies, OPVs with plasmonic TCEs of 1D metallic nanogratings have been demonstrated theoretically and experimentally to achieve stronger optical absorption and higher PCEs than that with the ITO electrode. The total absorptivity and total absorption enhancement in the organic active layers can be enhanced up to a maximum level of 0.24 and 50% for such 1D Ag nanograting electrodes at the top interface, or total absorption enhancement of 67% for coupled parallel 1D Ag nanogratings at the top and bottom interfaces considering both transverse-magnetic (TM) and transverse-electric (TE) polarizations under AM 1.5 illumination. In addition, the enhanced short circuit current density $J_{sc}$ (40%) and PCE (35%) of small molecular OPVs with 1D Ag nanogratings were experimentally demonstrated. However, in 1D metallic nanogratings, SPRs could only be excited for one specific polarization (TM) to enhance the optical absorption in active layers, which is not optimum for unpolarized sunlight. It bears noting that in the foregoing dual parallel 1D metallic nanogratings, the dual parallel 1D metallic nanogratings have not made full use of light-trapping capabilities of plasmonic nanostructures. This is because SPRs could only be excited under one specific polarization (TM polarization) in 1D metallic nanogratings. Hence, the enhancement of optical absorption in active layers is not optimum for incident sunlight, which contains multiple (different) polarizations. However, in the present invention, the inventors are the first to propose double perpendicular 1D metallic nanogratings in molecular OPVs to achieve broadband and polarization-independent optical absorption enhancement, thereby significantly enhancing the total optical absorption (e.g. 200%, compared to 67% for the previous work).

On the other hand, most recently, 2D Ag nanogratings or nanogrids (NGs) have been investigated in terms of their optical and electrical properties, yielding higher optical transmission and lower electrical resistivity than that of an 80 nm thick ITO electrode. However, no study has appeared on optical absorption enhancement in OPVs with 2D plasmonic TCEs, in which 2D plasmonic TCEs provide the polarization-independent light trapping and further enhance the optical absorption in organic active layers, which is highly desirable for the low-cost and high-efficiency PV technologies. Previously, others have studied 2D metallic nanogrids or nanohole arrays but only for transparent conducting electrode applications. More specifically, they studied the optical transmission and electrical conductivity of these structures. No active PV layers were involved. Study of the optical absorption enhancement in active layers of OPVs with 2D metallic NGs were still lacking, and is a totally different consideration. The present invention focuses on the different aspects (i.e. optical absorption enhancement in active layers of OPVs) from the prior other work.

According to the present invention therefore, a unique OPV solar cell structure is provided that includes a 2D metallic nanogrid (NG) as a plasmonic TCE to realize broadband and polarization-independent optical absorption enhancement in the active layers of small molecular OPVs. In one exemplary non-limiting embodiment, the nanogrid is formed of Ag (silver); however, other suitable conductive metals (e.g. gold or aluminum) may be used. The present OPV device as further described herein with the Ag NG top electrode/organic active layer/Ag film bottom electrode structure are intended to function as a perfect light absorber with broadband and wide angle absorption.

It should be noted that one-dimensional (1D) metallic nanogratings used in a single OPV device layer, in which surface plasmon resonances enhance the optical absorption for only one polarization, are not optimum for unpolarized sunlight. By contrast, the present 2D plasmonic Ag nanogrid provided herein advantageously can serve as transparent electrodes, and simultaneously provide polarization-independent light trapping that can further enhance the optical absorption in OPVs, resulting in higher power conversion efficiency (PCE).

FIG. 1 illustrates one exemplary embodiment of a thin film OPV solar cell 100 according to the present disclosure that replaces a conventional ITO top transparent conducting electrode (TCE) with an ultrathin plasmonic TCE composite structure, which in one embodiment may be comprised of a transparent conductive polymer with embedded two-dimensional (2D) nanogrid, as further described herein.

Solar cell 100 generally includes a bottom electrode layer 110, an electron transport layer 120 disposed thereon that enhances transport of electrons to the bottom electrode layer, an organic active bilayer 130 disposed thereon comprising an acceptor layer 132 and a donor layer 134, a top plasmonic transparent conducting electrode (TCE) layer 140 disposed thereon, and a transparent top substrate 150 disposed thereon. In one embodiment, the top substrate 150 may be glass or polymer selected for optimal light transmittance from a photon energy source such as sunlight incident thereon to the TCE layer 140 immediately below. The top substrate 150 protects the OPV device formed below from the environment.

The bottom electrode layer 110 may be formed of any suitable electrically conductive material, such as without limitation a metal including silver (Ag) in one exemplary embodiment. Other suitable conductive metals (e.g. aluminum, etc.) and non-metals (e.g. polymers, etc.) may be used in some embodiments. The bottom electrode layer 110 may have any suitable thickness. In one embodiment, the bottom electrode layer 110 may have a thickness of 80 nm.

The electron transport layer 120 may be formed of any suitable material. In one non-limiting embodiment, the layer 120 may be formed for example of bathocuproine (BCP) having a thickness of about 8 nm. Other thicknesses may be used to optimize the solar cell PCE. In general, the BCP electron transport layer 120 transports electrons to the bottom electrode layer 110 from the adjoining acceptor layer 132 while effectively are blocking excitons in the lower-energy-gap acceptor layer from recombining at the bottom electrode, which degrades the power conversion efficiency of the OPV solar cell.

The organic active bilayer 130 may be formed of any suitable combination of an acceptor layer 132 and donor layer 134 made of organic polymer materials selected to form a heterojunction at an interface between the acceptor and donor layers. In one non-limiting embodiment, the acceptor layer 132 may be formed of 3,4,9,10-perylenetetracarboxylic bis-benzimidazole (PTCBI) and the donor layer 134 may be formed of copper pthalocyanine (CuPc). In one embodiment, the acceptor layer 132 and donor layer 134 may each have a thickness of about 10 nm. Other suitable thicknesses or different thicknesses may be used so long as the power conversion efficiency of the solar cell 100 is not degraded.

As noted above, the TCE layer 140 may be formed of an ultrathin 2D metallic nanogrid 170 embedded in a transparent conductive material 160. Nanogrid 170 may be formed of any suitable conductive metal, such as without limitation silver (Ag). Other conductive metals suitable for a plasmonic nanogrid fabrication may be used (e.g. gold or aluminum). In one embodiment, conductive material 160 may be a transparent conductive polymer such as PEDOT: PSS (poly(3,4-ethylenedioxythiophene) poly(styrenesulfonate)). The transparent conductive material 160 fills the open interstitial spaces formed between the nanogrid 170 and structural reinforces and stabilizes the nanogrid. TCE layer 140 may have a thickness substantially the same as nanogrid 170 which is embedded therein.

Nanogrid 170 has a thickness and other geometric parameters selected to be capable of exciting surface plasmonic resonances at the nanogrid 170/active bilayer 130 interface when exposed to incident light on TCE layer 140. On that basis, for optimizing light absorption in the active bilayer 130, nanogrid 170 may have a thickness ($t_1$) of less than 100 nm, and more preferably in some embodiments in a range from and including 10 nm to 50 nm, and most preferably from and including 20 nm to 50 nm based on the results depicted in FIG. 3A further described herein. In one specific non-limiting example, nanogrid 170 has a thickness of about 30 nm yielding a maximum photon absorption in the active bilayer 130 (0.495) with a corresponding linear element or nanowire linewidth of 70 nm (see, e.g. FIG. 3A). It will be appreciated that other suitable thicknesses of nanogrid 170 may be used so long as surface plasmonic resonances may be excited at the nanogrid/active bilayer 130 interface. Transparent conductive material 160 may have a thickness substantially the same as the foregoing nanogrid thicknesses selected.

Figure 1B:
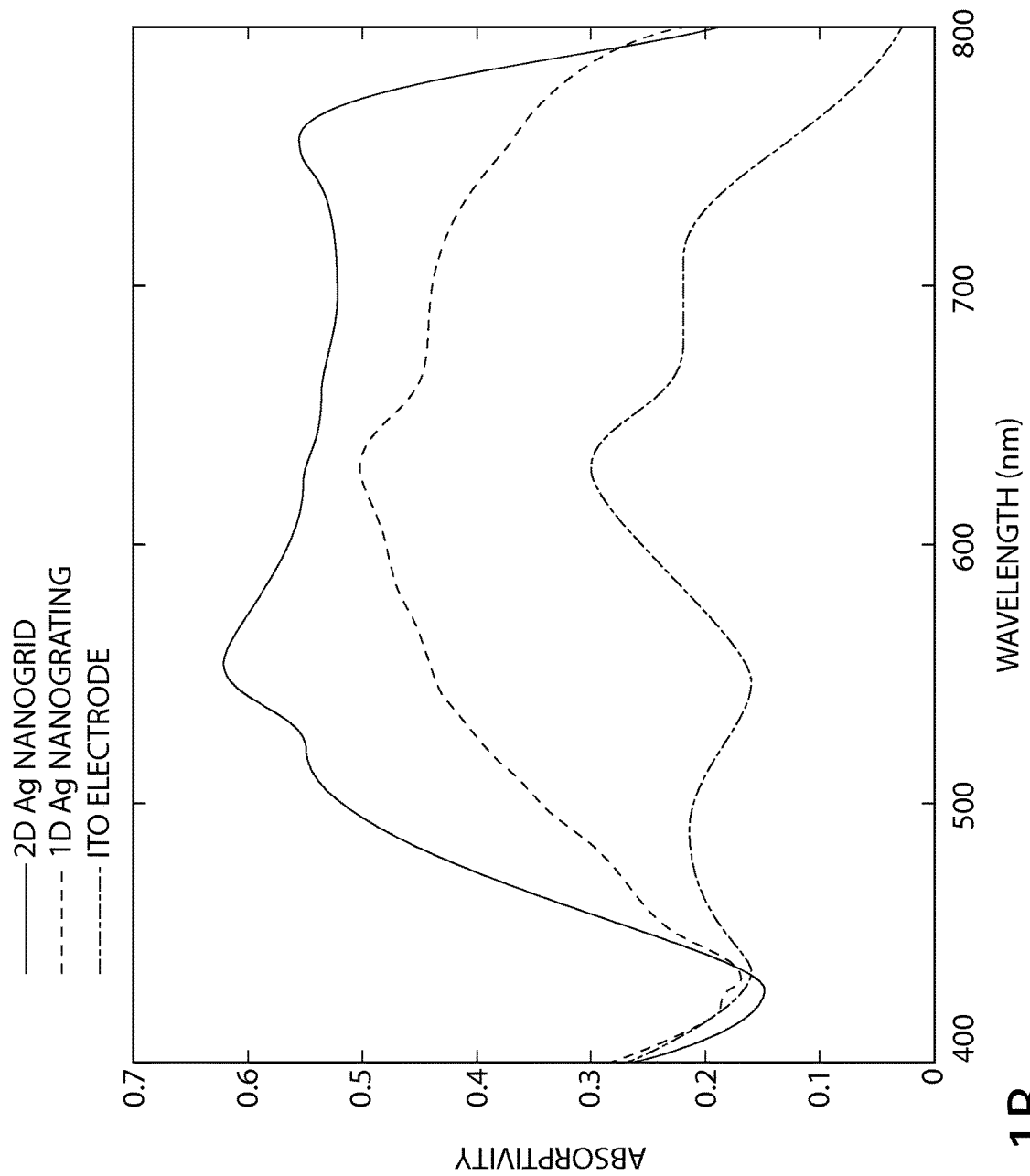
FIG. 1B shows the calculated optical absorption spectra of the OPV solar cell with 2D Ag (silver) nanogrid compared with a single one-dimensional (1D) nanograting and a conventional ITO (indium tin oxide) transparent conducting electrode.
Figures 1C, 1D, 1E:
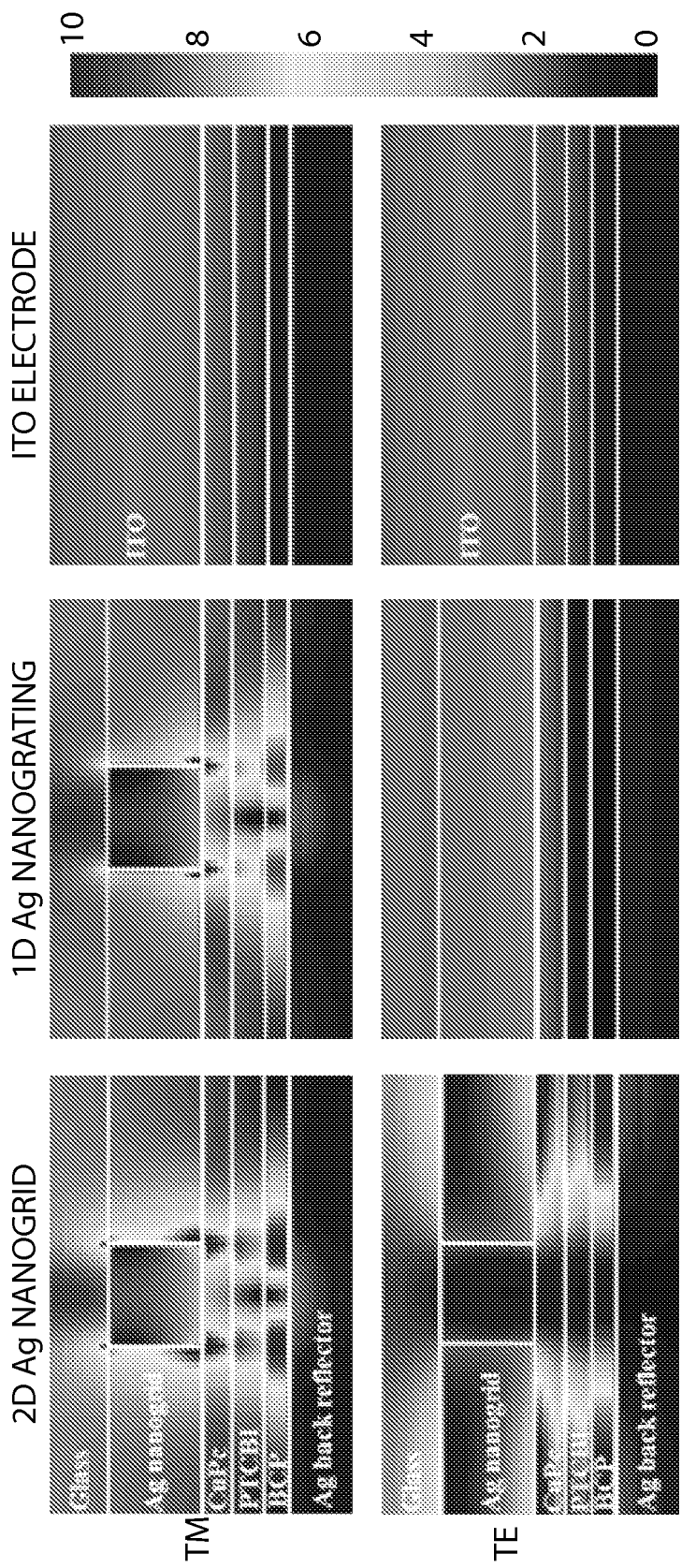
FIGS. 1C-1E show calculated electric field distributions for OPV solar cells with (1C) 2D Ag nanogrid, (1D) 1D Ag nanograting, and (1E) conventional ITO electrodes under TM (top panels) or TE (lower panels) polarized illuminations at the wavelength $\lambda=750$ nm.
Figure 2A:
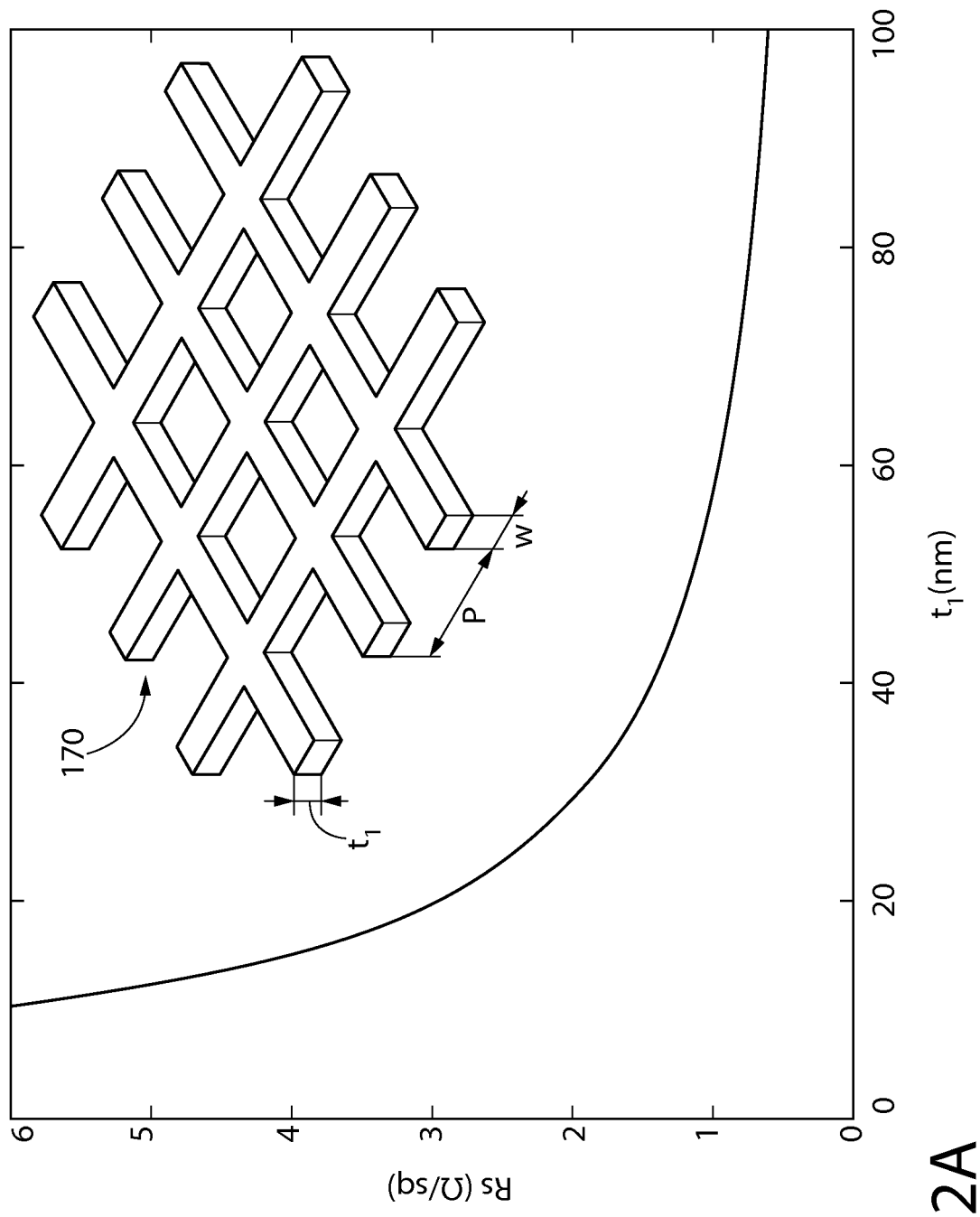
FIG. 2A shows the electrical sheet resistance of the 2D Ag nanogrid electrode as a function of film thickness t1.

With continuing reference to FIG. 1 and reference to FIG. 2A, nanogrid 170 may be comprised of a plurality of elongated and intersecting metallic linear elements 173 (e.g. nanowires) extending in at least two different axial directions oriented substantially parallel to the plane of the TCE layer 140 (i.e. perpendicular to the thickness of layer 140). A plurality of grid openings 174 are thus formed in nanogrid 170. In one non-limiting embodiment, nanogrid 170 may have a rectilinear configuration. Such a configuration of nanogrid 170 may include a first array 171 of linear elements 173 arranged parallel and equidistant to each other and a second array 172 of linear elements 173 arranged parallel and equidistant to each other. The angle formed between the intersecting linear elements 173 may be about 90 degrees (i.e. perpendicular) producing square or rectangular openings 174. In some embodiments, the linear elements 173 in each array 171, 172 may be spaced apart in non-uniform fashion rather than equidistant to each other. Accordingly, the nanogrid 170 is not limited to equidistant spaced linear elements 173.

As indicated in FIG. 2A, the linear elements 173 in each array may be spaced apart at a pitch or period P and have a linewidth w with a thickness $t_1$. In one exemplary embodiment, without limitation, pitch P=300 nm and linewidth w=70 nm on a 30 nm-thick ($t_1$) Ag nanogrid film. In some embodiments, the period P may be non-uniform and vary between the linear elements 173. The linear elements 173 forming nanogrid 170 disclosed herein preferably may have a thickness $t_1$ that is thin enough to excite surface plasmon resonances at the nanogrid-active bilayer 130 interface, and therefore are distinguishable from macroscopic conductive metallic gratings or grids which are incapable of exciting surface plasmonic resonances. The thickness and other geometric parameters are determined by optimizing the total photon absorption in active layers of OPVs, as shown in FIG. 3.

It should be noted that metallic macrogratings have been widely studied as TCE to replace ITO electrodes over the past decade. But none of them can be used to excite SPRs (surface plasmon resonances) and enhance the optical absorption in active layers of OPVs (i.e. their geometric parameters are above micron-levels, which means the reciprocal lattice vectors are too small to bridge the momentum mismatch for the excitation of SPRs at visible wavelengths). Therefore, macrogratings cannot solve the fundamental obstacle preventing the commercialization of OPVs: low optical absorption in ultrathin active layers.

In other embodiments, the intersecting linear elements 173 of the first and second array 171, 172 may be oriented at an angle between 0 and 180 degrees other than 90 degrees, and may therefore form an oblique angle to each other. In addition, three or more arrays of parallel linear elements 173 extending in three or more axial directions to form polygonal grid openings 174 having a shape other than rectilinear. For example, without limitation, triangular openings 174 (e.g. formed by three obliquely oriented intersecting arrays of linear elements), asymmetric blazed nanogrids, and other shapes may be provided.

Figure 3A:
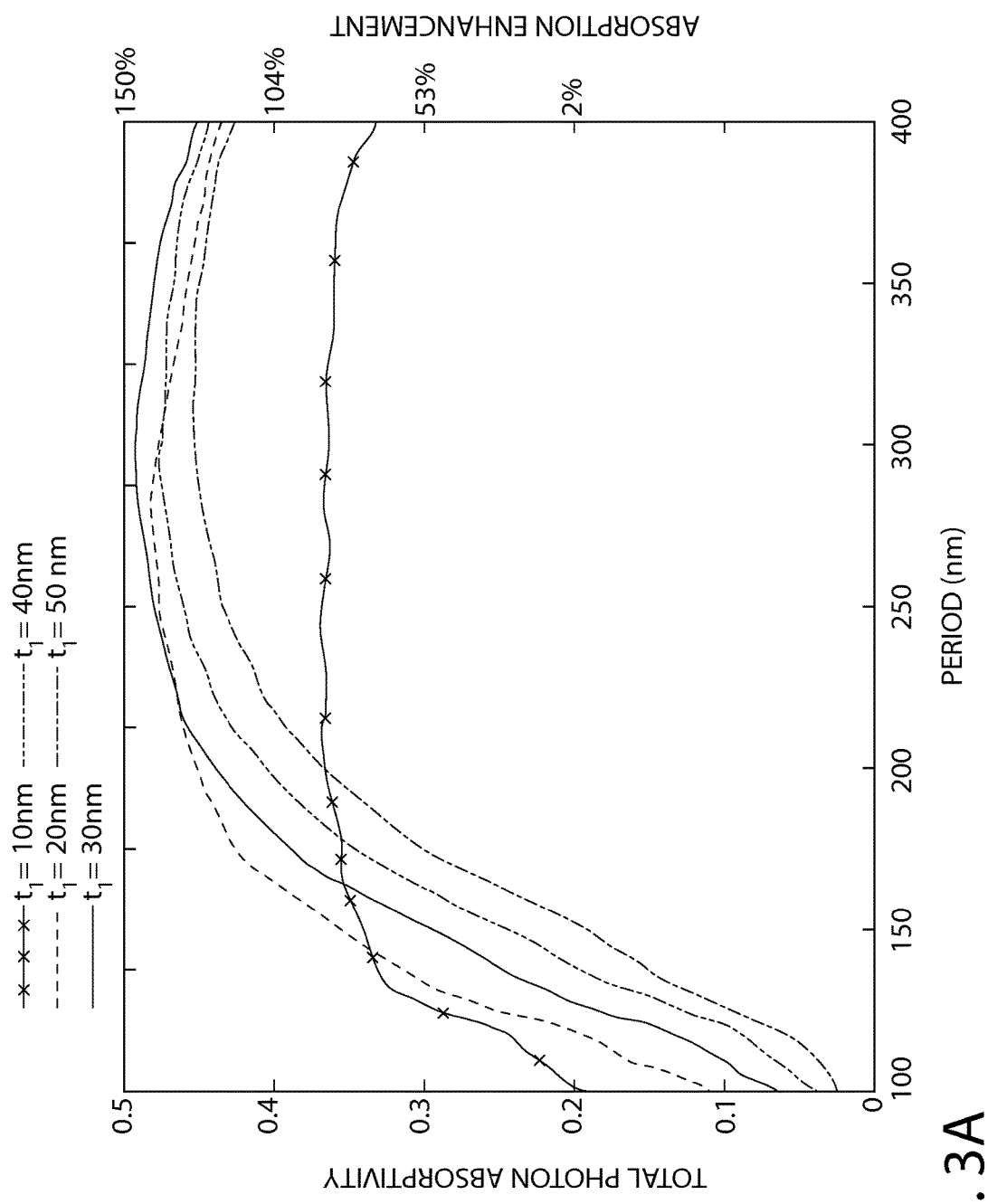
FIGS. 3A and 3B show the total photon absorptivity and total photon absorptivity enhancement in OPVs as a function of 2D Ag nanogrid period P and (FIG. 3A) thickness $t_1$ when the linewidth w is fixed at 70 nm.
Figure 3B:
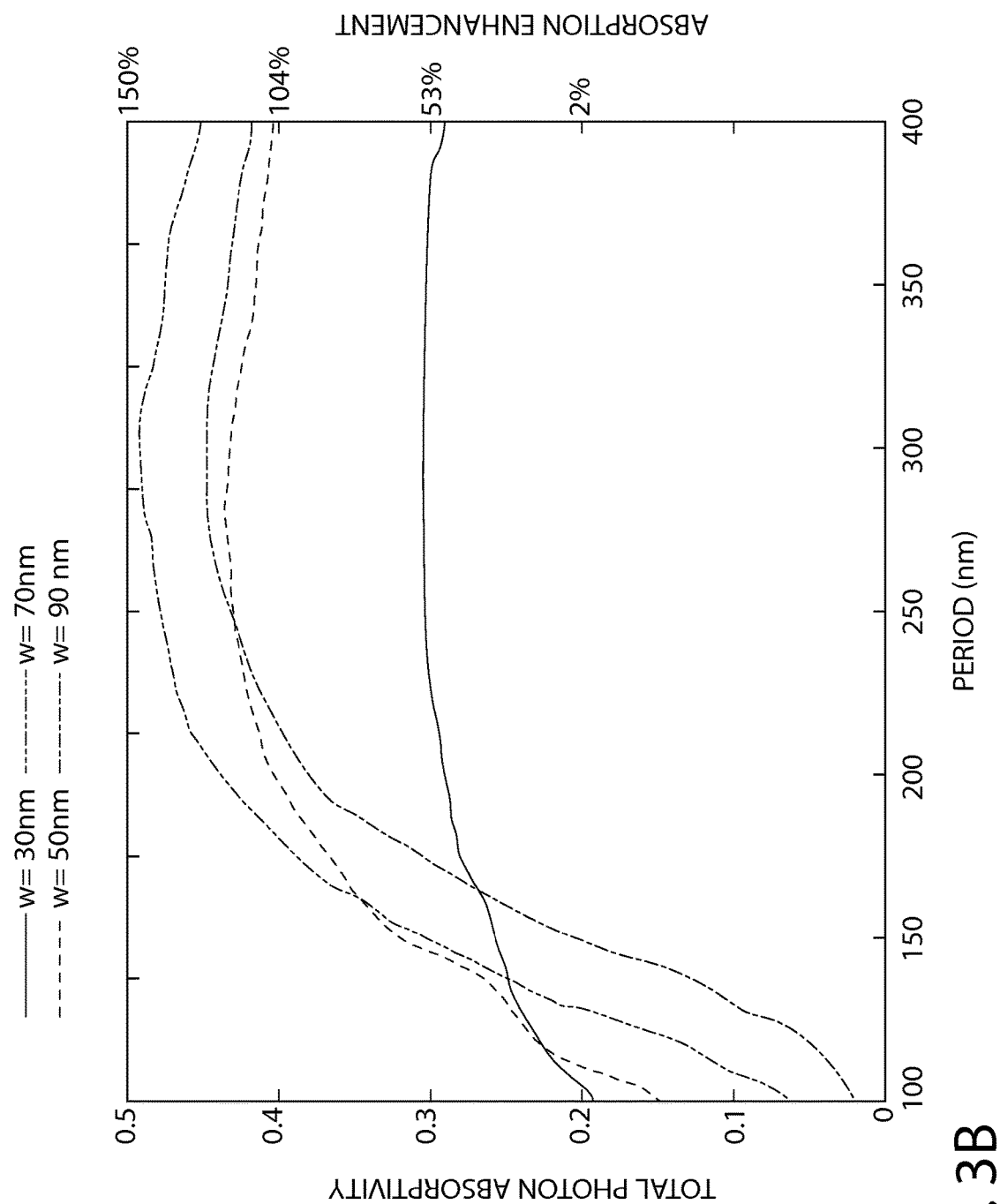

With additional reference to FIG. 3B, the linear elements 173 may have a linewidth w from and including 30 nm to 90 nm, and preferably from and including 50 nm to 90 nm in some non-limiting embodiments when the thickness ($t_1$) of the linear element (i.e. nanogrid 170 is 30 nm. In one embodiment, the linewidth w may be 70 nm which is associated with a maximum total photon absorptivity of 0.495.

TCE layer 140 with embedded nanogrid 170 may be formed by any suitable method used in the art. In one example, a 30 nm thick Ag nanogrid 170 may be first fabricated on a glass top substrate 150 and then embedded in an ultrathin spin-coated PEDOT:PSS film of transparent conductive material 160 having substantially the same thickness. The nanogrid 170 may be fabricated to the desired size and configuration by focused ion beam milling (e.g. FEI Dual-Beam system 235) from a solid substantially planar Ag film which was first deposited by e-beam evaporation (e.g. Indel system) onto the glass top substrate 150. Other suitable methods used in the art may be used to fabricate the nanogrid 170 and openings therein including standard semiconductor type fabrication techniques, for example without limitation optical photoresist lithography, nano-printing, nano-injection molding, and others. Accordingly, the invention is not limited by the manner of fabricating nanogrid 170.

FIG. 1B shows the calculated optical absorption spectra [$A_{total}(\lambda)$] of the small molecular OPVs in the active organic layers (bilayer 130) with the 2D Ag NGs (w=70 nm, P=300 nm, solid curve), 1D Ag nanogratings (w=70 nm, P=300 nm, dashed curve) and 100 nm-thick ITO electrodes (dash-dot-dash curve) for the unpolarized incident light. The optical absorption spectrum of OPVs illuminated by normally incident TM and TE polarized plane-waves are $A_{TM}(\lambda)$ and $A_{TE}(\lambda)$, respectively, which are averaged to calculate the overall optical absorption spectrum under the unpolarized illumination, $A_{Total}(\lambda)=(A_{TM}(\lambda)+A_{TE}(\lambda))/2$. It clearly shows that the optical absorption spectrum [$A_{Total}(\lambda)$] in active layers with the 2D Ag NGs electrode is much stronger and broader than that with ITO or 1D Ag nanogratings electrodes. Compared with OPVs with ITO electrodes, the broadband absorption enhancement in OPVs with 1D Ag nanogratings or 2D Ag NGs is attributed to the excitation of SPRs at the nanostructured-metal/dielectric interfaces, and the formation of plasmonic cavity modes between the 1D or 2D plasmonic TCEs and the metal back reflector, which could confine and enhance the electromagnetic field in the ultrathin active layers, resulting in the enhanced optical absorption.

FIGS. 1C-E show that much higher electric field intensity confined in the CuPc:PTCBI active layers (bi-layer 130) is obtained with 1D Ag nanogratings (TM polarization) or 2D Ag nanogrids (NGs) (TM and TE polarizations) electrodes than that with the ITO electrode at the wavelength of 750 nm. On the other hand, due to the polarization-dependence of SPRs in 1D Ag nanogratings, the field intensity in active layers with 1D Ag nanogratings could be enhanced by the excitation of SPRs only for the TM-polarized incident light, as shown in the top panel of FIG. 1D. In contrast, for the TE-polarized incident light, 1D Ag nanogratings result in slight suppression of the absorption in active layers, since they do not support SPRs or waveguide modes in active layers and block part of the incident light, as the lower panel of FIG. 1D shows. So the overall optical absorption ($A_{Total}(\lambda)$) in active layers with 1D Ag nanogratings is weaker than that with 2D Ag NGs, in which both TM and TE polarized incident light could excite SPRs, resulting in the enhanced field intensity in active layers, as shown in FIG. 1C.

The proposed plasmonic TCEs are much thinner than typical metal films used in optical studies. And their thickness (tens of nanometers) is comparable to the skin depth of Ag at optical frequencies. As a result, the physical mechanisms of such ultrathin metallic electrode could be quite different from that of optically thick metal films. In general, the electrical properties of an electrode can be described by its sheet resistance. The 2D Ag NGs of linewidth w, thickness $t_1$ and period P (see the inset of FIG. 2A) has a sheet resistance $R_s=(\rho/t_1)(P/w)$. If the electrical resistivity of bulk Ag film is $\rho=1.58\times10^{-8}$ $\Omega\cdot$m, the typical $R_s$ will change from 0.65 to 6.5 $\Omega$/sq when the thickness $t_1$ of Ag NGs decreases from 100 to 10 nm (P=300 nm and w=70 nm), as depicted in FIG. 2A, which agree reasonably well with experimental results. The sheet resistance of 2D Ag NGs is well below that of the ITO electrode (~10 $\Omega$/sq) used for OPVs, indicating a better electrical performance.

The optical properties of the 2D Ag NGs disclosed above are characterized below with respect to the following exemplary construction.

Example 1 (2D Nanogrid)

Figure 2B:
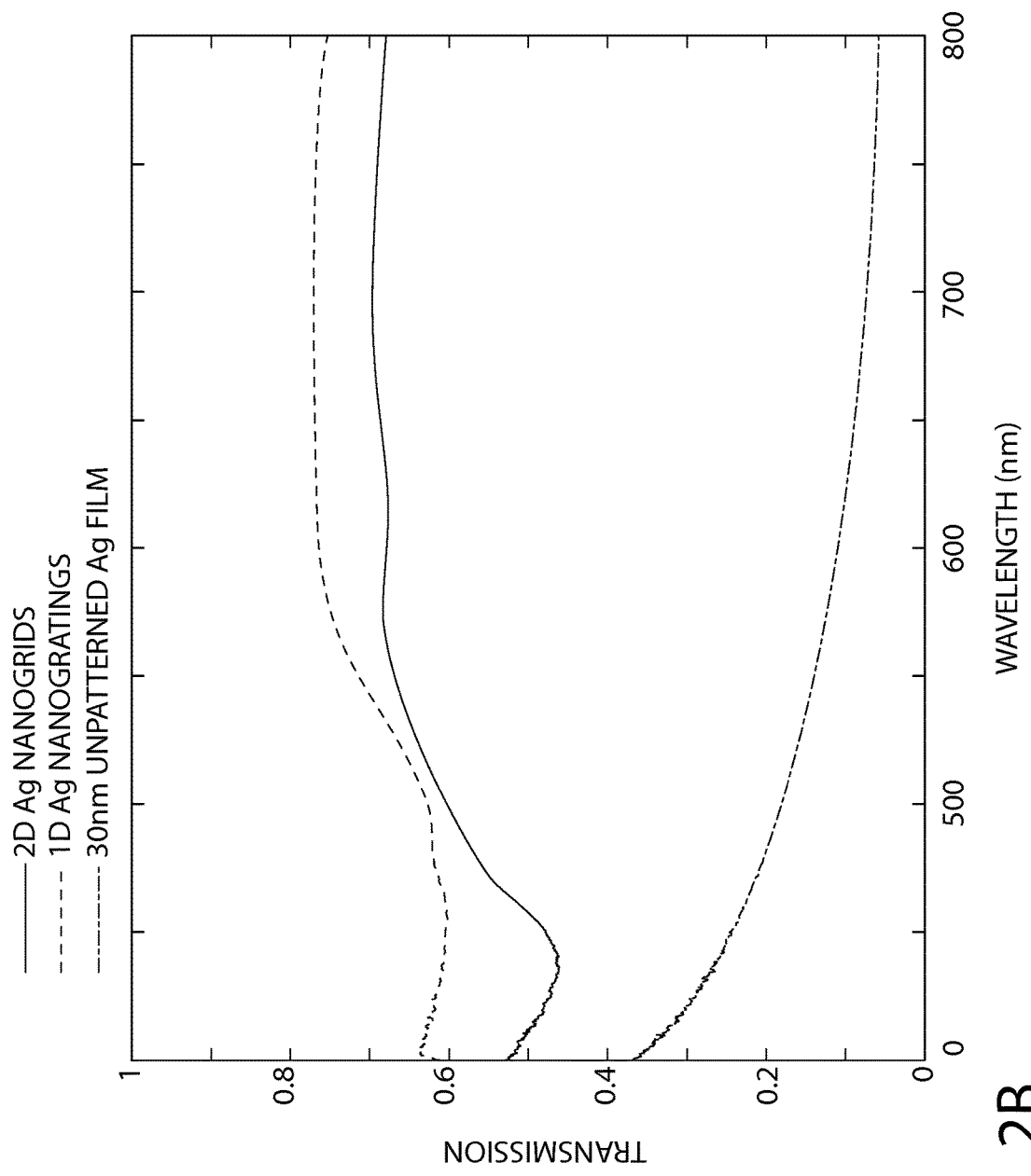
FIG. 2B shows the measured optical transmission through the 2D Ag nanogrid compared with a single one-dimensional (1D) nanograting and a 30 nm-thick unpatterned Ag film.
Figure 7:
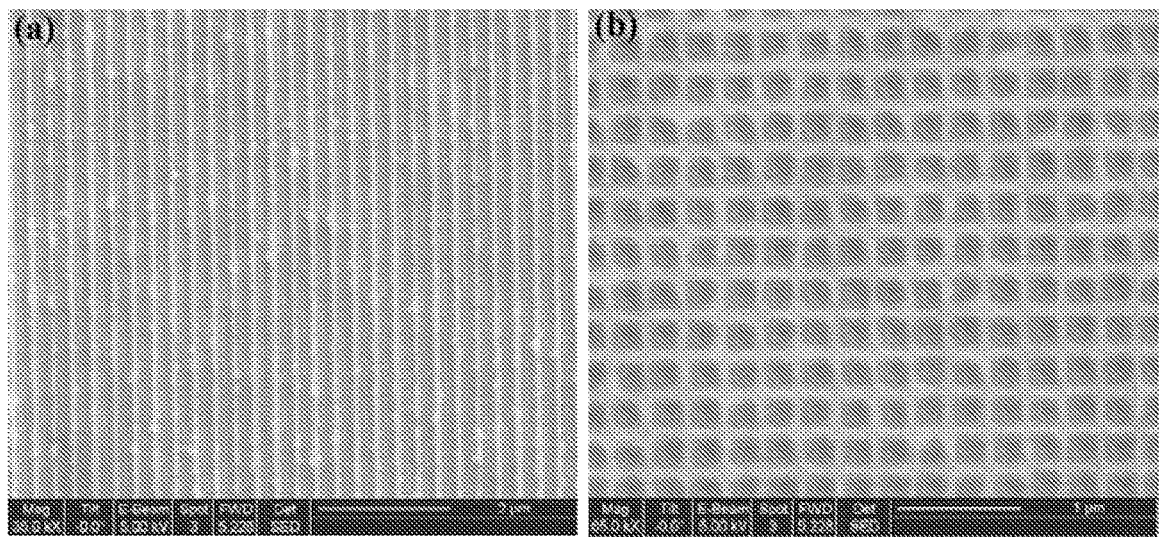
FIG. 7 shows SEM (scanning electron microscope) images of (a) 1D Ag nanogratings and (b) 2D Ag nanogrid with P=300 nm, w=70 nm fabricated on 30 nm-thick Ag films.
Figure 8:
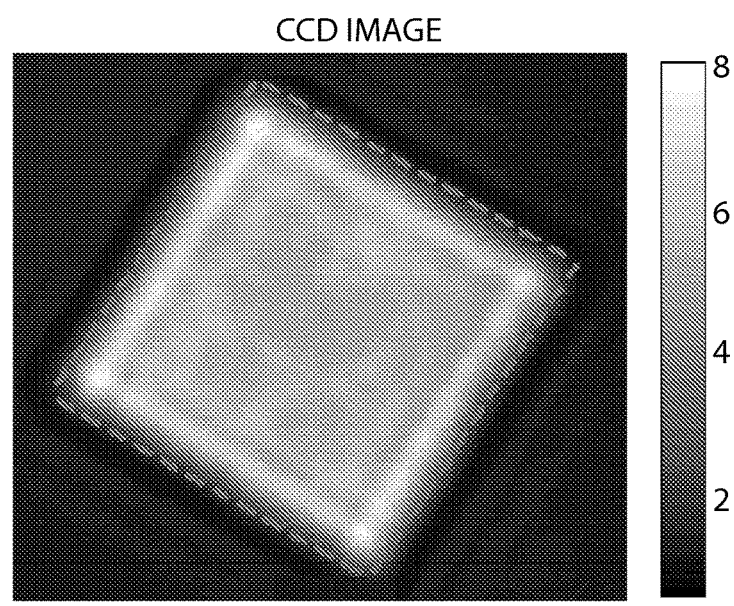
FIG. 8 is a CCD image (Cooke sensicam qe) of the fabricated 2D Ag nanogrid of FIG. 7B (enclosed by the red dashed box) under white light illumination.
Figure 9A:
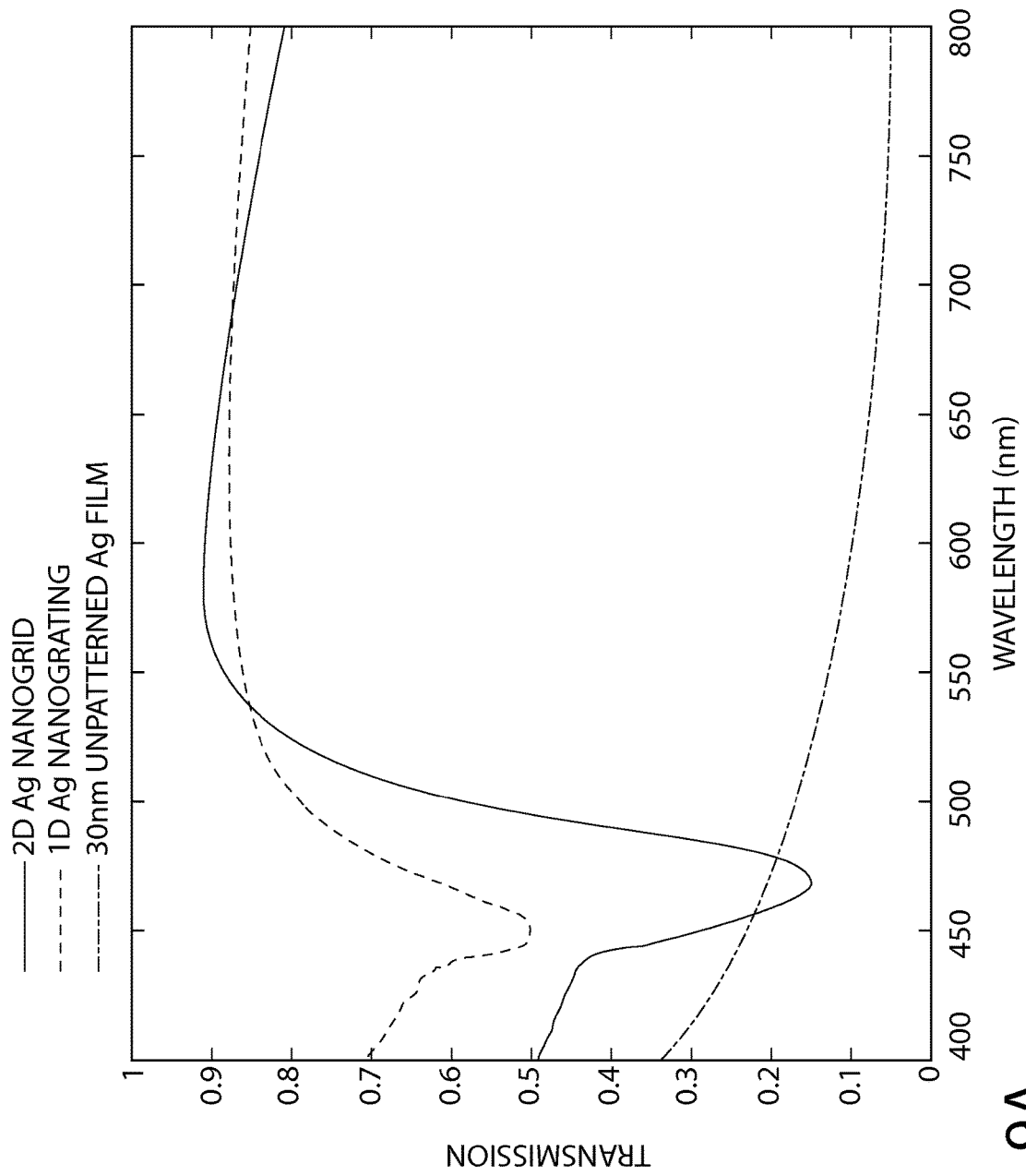
FIG. 9A shows simulated transmission spectra through 30 nm-thick Ag film with 2D Ag nanogrids (period P=300 nm and linewidth w=70 nm), 1D Ag nanograting (period P=300 nm and linewidth w=70 nm) and 30 nm-thick unpatterned Ag film.
Figure 9B:
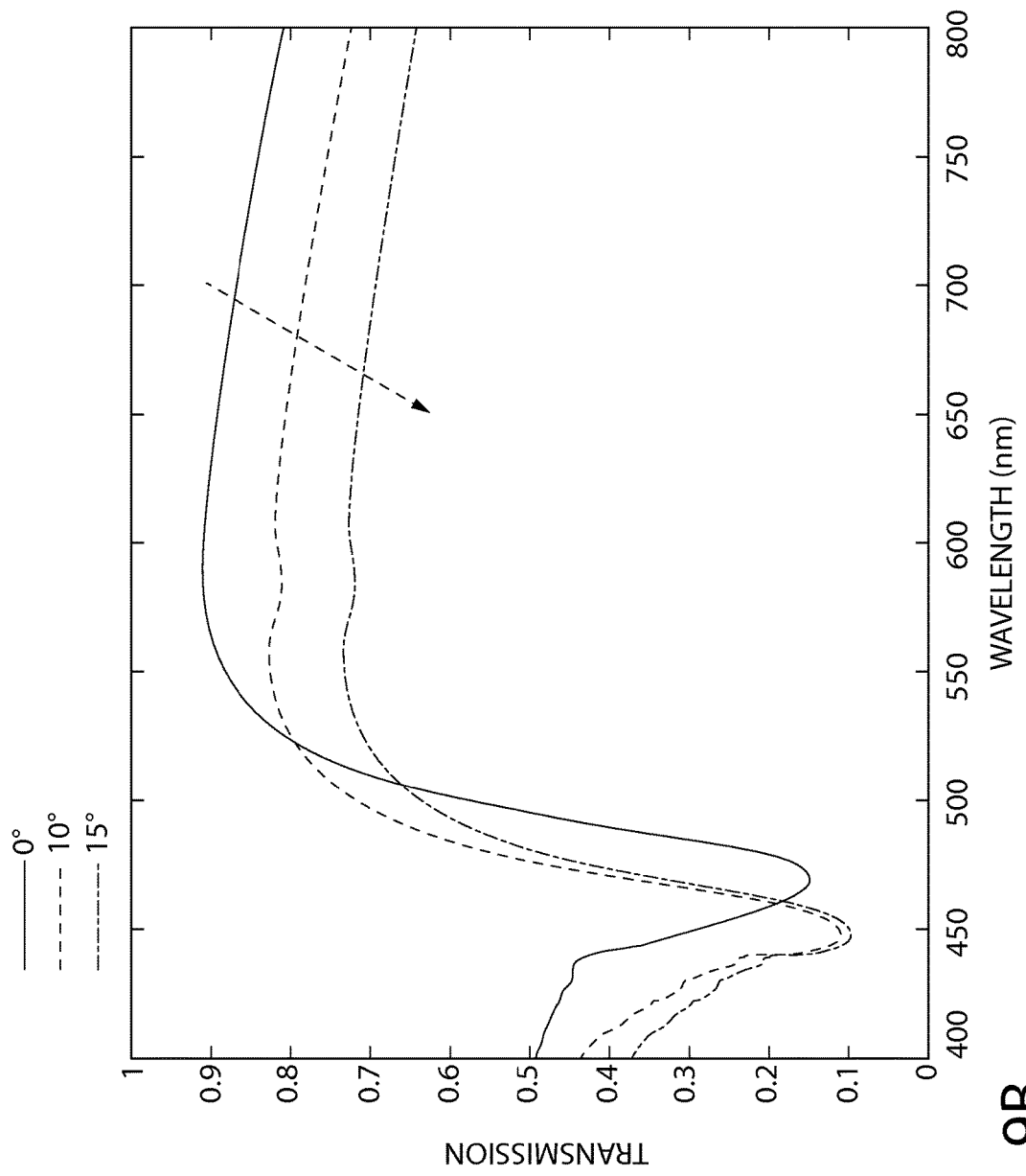
FIG. 9B shows simulated transmission spectra of 30 nm-thick 2D Ag nanogrids (period P=300 nm and linewidth w=70 nm) under different incident angles (0°, 10°, and 15°).
Figure 9C:
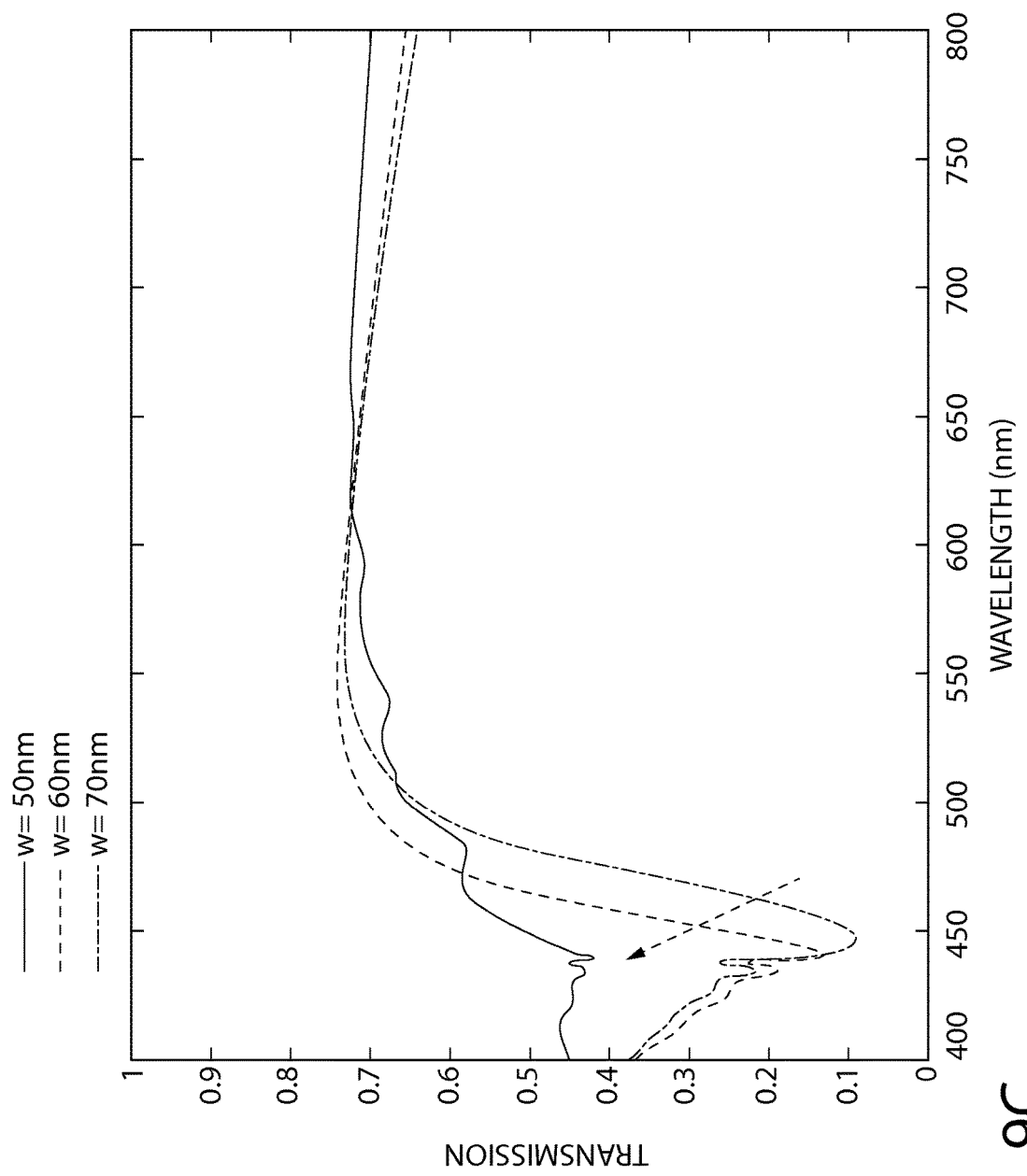
FIG. 9C shows simulated transmission spectra of 30 nm-thick 2D Ag nanogrids with different linewidth w (50 nm, 60 nm and 70 nm) when the period and incident angle are fixed at P=300 nm and 15°, respectively.

Focused ion beam milling (FEI Dual-Beam system 235) was used to fabricate 2D Ag NGs and 1D Ag nanogratings with period P=300 nm and linewidth w=70 nm on a 30 nm-thick Ag film (see, e.g. FIG. 7), which was deposited by e-beam evaporation (Indel system) onto a standard microscope slide (Fisherbrand). An Olympus X81 inverted microscope was employed to measure the optical transmission through the nanostructures (see, e.g. FIG. 8). FIG. 2B shows the absolute transmission spectra (normalized to the transmission through a bare microscope slide) for 2D Ag NGs (solid curve), 1D Ag nanogratings (dashed curve), and 30 nm-thick Ag film without nanostructures (dash-dot-dash curve), which were measured by the fiber-based compact spectrometer (Ocean Optics USB 4000). Although there are some differences between experimental and numerical results due to fabrication (i.e. variations in linewidth of NGs or nanogratings, surface roughness) and measurement errors (i.e. nonparallel incident light employed in the measurement) (see, e.g. FIGS. 9A-C), the obvious transmission valleys are observed centered at a wavelength of 450 nm for 2D Ag NGs and 1D Ag nanogratings, which are attributed to the excitation of localized surface plasmon resonances (LSPRs) of individual Ag nanowires. The optical transmission for 2D Ag NGs and 1D Ag nanogratings are much higher than that of the unpatterned Ag film over the broad wavelength range (400~800 nm). In addition, the optical transmission of 1D Ag nanogratings is a little higher than that of 2D Ag NGs. However, the transmission valley around LSPRs resonant wavelength of 450 nm is deeper in 2D Ag NGs, indicating that LSPRs in 2D Ag NGs are stronger than that in 1D Ag nanogratings due to the polarization-independent excitation of LSPRs in 2D Ag NGs. The stronger LSPRs could generate higher localized field intensity and greater absorption enhancement in the active layers of OPVs.

Figure 2C:
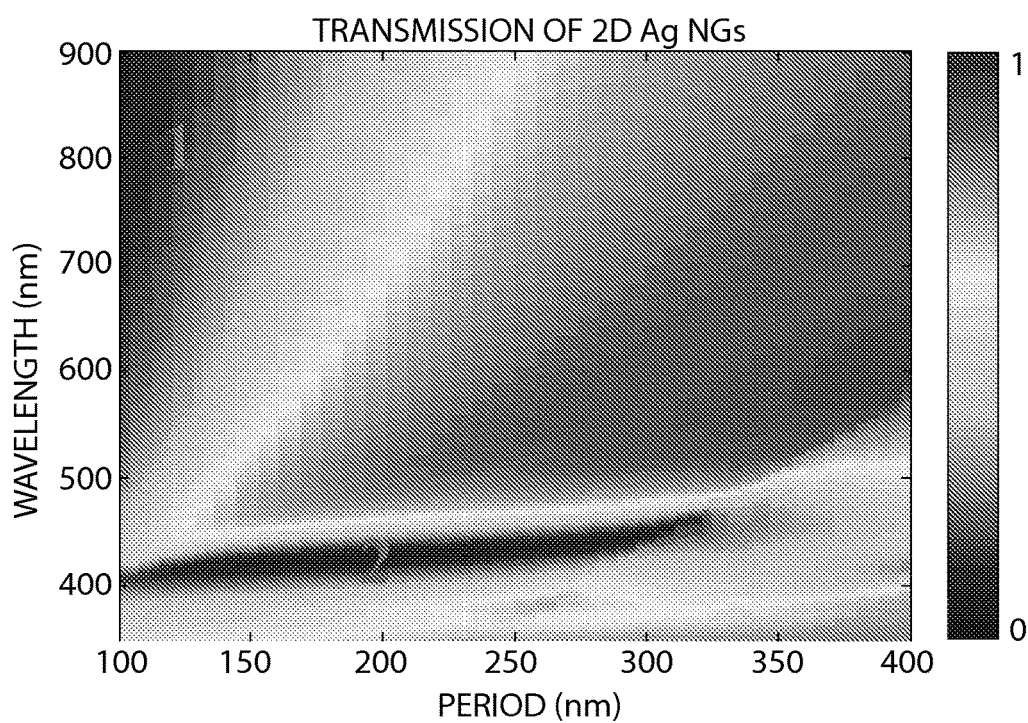
FIGS. 2C and 2D are two-dimensional maps of the calculated optical transmission and absorption spectra respectively for 2D Ag nanogrids as a function of the period P and incident wavelength when the linewidth w and thickness $t_1$ are fixed at 70 nm and 30 nm, respectively. The black solid and dash-dotted (dashed) curves in FIG. 2D refer to the analytical dispersion relations of SRSPP modes and Rayleigh-Wood anomaly (RA) at the Ag/glass (air/Ag) interface, respectively.

3D FDTD simulations were used to further investigate the physical mechanisms responsible for the optical properties of 2D Ag NGs. In the simulations, 2D Ag NGs with linewidth w, thickness (height) $t_1$ and period P were positioned on a semi-infinite glass substrate. FIG. 2C shows 2D maps of the calculated transmission spectra for 2D Ag NGs as a function of the period and incident wavelength when the linewidth and thickness are fixed at w=70 nm and $t_1$=30 nm, respectively. There are two low-transmission regions marked by number 1 and 2 in FIG. 2C. The decreased transmission in region 1 (650 nm<$\lambda$<900 nm and 100 nm<P<160 nm) is caused by the high optical reflection of 2D Ag NGs, due to the cutoff of propagating TE mode supported by the vertically oriented metal-insulator-metal (MIM) waveguide (formed by the Ag NGs and air in between). For wavelengths larger than 650 nm (100 nm<P<160 nm), the propagating TE mode becomes evanescent and no longer transmits through the MIM waveguide.

Figure 2D:
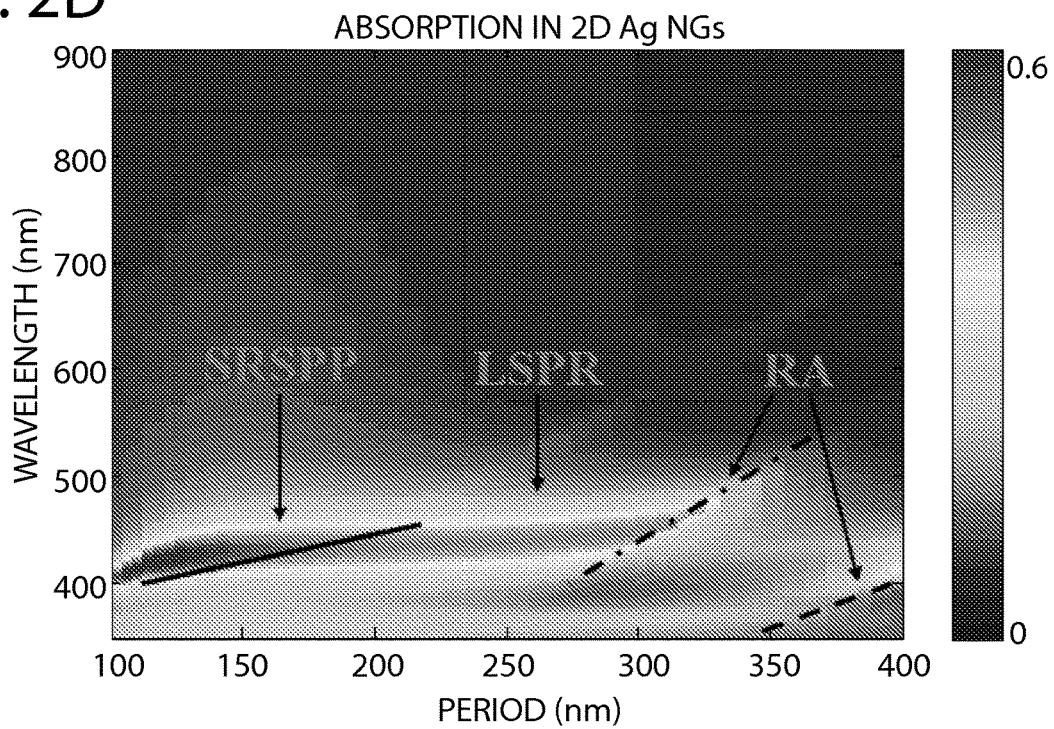

In addition, the low transmission in region 2 (350 nm<$\lambda$<500 nm and 100 nm<P<400 nm) is mainly attributed to the absorption in 2D Ag NGs, as shown in FIG. 2D. There are three different mechanisms for the absorption in 2D Ag NGs. First of all, in the ultrathin 2D Ag NGs ($t_1$=30 nm), the two single-interface SP modes at the top and bottom Ag-dielectric interfaces would interact with each other and lead to coupled SP modes, the long-range and short-range surface plasmon polariton (LR- and SR-SPP) modes. The dispersion relations for LR- and SRSPP modes can be described by the following equation:

$$\tan h(k_2 t) \in_{d1} \in_{d2} k_2^2 + \in_m^2 k_1 k_3) + \in_m k_2(\in_{d1} k_3 + \in_{d2} k_1) = 0 \quad (1)$$

Here $k_1^2 = k_{spp}^2 - \in_{d1} k_0^2$, $k_2^2 = k_{spp}^2 - \in_m k_0^2$, $k_3^2 = k_{spp}^2 - \in_{d2} k_0^2$, $k_0 = \omega/c$ and $t_1$ is the thickness of the metal film. $\in_{d1}$, $\in_{d2}$ and $\in_m$ are dielectric constants of air, glass and Ag, respectively. For the ultrathin Ag film ($t_1$=30 nm) with an asymmetric geometry ($\in_{d1} < \in_{d2}$), Eq. (1) yields only strongly damped SRSPP modes with asymmetric Ez field patterns at the top (SiO$_2$/Ag) and bottom (Air/Ag) interfaces. It is also known that the momentum mismatch between surface plasmon modes and free space light can be bridged by the reciprocal vectors of periodic nanostructures $k_G = mG_x + nG_y (|G_x| = |G_y| = 2\pi/P$, m and n are integers):

$$k_{spp} = k_0 \sin \theta + mG_x + nG_y \quad (2)$$

where $\theta$ is the incident angle. The dispersion relation of SRSPP modes can be obtained by substituting Eq. (2) into Eq. (1) for the normal incidence ($\theta = 0°$). As a result, the black dashed curve in FIG. 2D is referred to the analytical dispersion curve of SRSPP modes excited by the lowest order reciprocal vectors $\{(m,n)=(1,0),(-1,0),(0,1),(0,-1)\}$ (100 nm<P<230 nm), which agrees well with the absorption spectra in 2D Ag NGs obtained by FDTD numerical simulations.

Next, as the period P continues to increase from 230 nm to 350 nm when the linewidth of NGs is fixed at w=70 nm, the distance between two adjacent Ag nanowires becomes larger, resulting in weak inter-coupling between them. Therefore, the absorption in 2D Ag NGs with period from 230 nm to 350 nm is attributed to LSPRs supported by individual Ag nanowires in NGs. The spectral positions of absorption spectra almost remain unchanged as the period of NGs increases from 230 nm to 350 nm, because the resonant wavelength of LSPRs is primarily determined by the geometry of individual Ag nanowires, which are fixed (w=70 nm, $t_1$=30 nm) as the period changes. Finally, when the critical coupling condition is met ($\omega/c \cdot \sqrt{\in_d} = k_0 \sin \theta + mG_x + nG_y$, $\in_d$ represents the dielectric constant of the adjacent material, such as air or glass), the typical Rayleigh-Wood anomaly (RA) occurs at Ag/glass and air/Ag interfaces, respectively, as shown by the black dash-dotted and dashed lines in FIG. 2D. The ±1 diffraction orders of the incident light are scattered parallel to the metal surface, giving rise to the strong optical absorption in Ag NGs. High optical transmission and low absorption in 2D Ag NGs are preferred for TCE applications.

In order to maximize the overall optical absorption in active layers of OPVs with 2D Ag NGs, the geometric parameters of 2D Ag NGs need to be optimized. The solar photon flux density is defined as $\Phi_s(\lambda) = S(\lambda) \cdot \lambda/hc$, where $S(\lambda)$ indicates the AM1.5 solar irradiance spectrum. The absorbed photon flux density, $A_{Total}(\lambda) \cdot \Phi_s(\lambda)$, for the OPV device is determined by the FDTD simulation, and $A_{Total}(\lambda)$ is the optical absorption in the active layers mentioned previously. The total photon absorptivity [$A_{photon}$], which represents the fraction of the total solar photon flux density that is absorbed in active layers, can be calculated using the equation:

$$A_{photon} = \int_{\lambda_{min}}^{\lambda_{max}} A_{Total}(\lambda) \cdot \Phi_s(\lambda) d\lambda / \int_{\lambda_{min}}^{\lambda_{max}} \Phi_s(\lambda) d\lambda \quad (4)$$

The wavelength region of interest is 400 nm<$\lambda$<800 nm for the CuPc:PTCBI active layers. And $A_{photon-ref}$ is the total photon absorptivity for the reference OPV with 100 nm-thick ITO electrodes. FIG. 3A gives the total photon absorptivity [$A_{photon}$] and total photon absorptivity enhancement [($A_{photon}/A_{photon-ref}-1) \cdot 100\%$] as a function of the period (P) and thickness ($t_1$) of 2D Ag NGs when the linewidth is fixed at w=70 nm. The total photon absorptivity with thinner Ag NGs is larger as the period changes from 100 nm to 150 nm, because the thinner Ag NGs have higher optical transmission in the spectral region of 650 nm<$\lambda$<800 nm. The total photon absorptivity continues to increase as the period increases up to 300 nm, in which 30 nm-thick Ag NGs have a maximum value of 0.495. In addition, FIG. 3B shows the total photon absorptivity and its enhancement as a function of the period (P) and linewidth (w) of 2D Ag NGs when the thickness is fixed at $t_1$=30 nm. Similarly, the maximum total photon absorptivity can be obtained when the linewidth is equal to 70 nm and the period is 300 nm. Therefore, the geometric parameters for 2D Ag NGs are optimized, which provide a maximum total photon absorptivity of 0.495, representing an enhancement of 150% in molecular OPVs compared to that with ITO electrodes. From FIGS. 3A and 3B, the total photon absorptivity is greatly enhanced for a large range of period (P) or thickness ($t_1$) of 2D Ag NGs, which is encouraging since it provides a good tolerance for the fabrication.

It is worth noting that the total photon absorptivity and its enhancement with the optimized 2D Ag NGs are 0.495 and 150%, respectively, which are even greater than that (0.45 and 128%) of our previous work on the molecular OPV device with 2D double plasmonic nanostructures, which consist of the top Ag nanodisc array and bottom Ag nanohole array. Obviously, the OPV device with 2D Ag NGs is much more practical and simpler than that with 2D double plasmonic nanostructures, in which it would be challenging to fabricate two different plasmonic nanostructures at the top and bottom interfaces. In addition, the integrated overall optical absorption over the whole wavelength region (400 nm<λ<800 nm) is defined as total absorptivity [A'$_{photon}$]:

$$A'_{photon} = \int_{\lambda_{min}}^{\lambda_{max}} \left( \frac{A_{TM}(\lambda) + A_{TE}(\lambda)}{2} \right) \cdot S(\lambda) d\lambda \bigg/ \int_{\lambda_{min}}^{\lambda_{max}} S(\lambda) d\lambda,$$

where $A_{TM}(\lambda)$ and $A_{TE}(\lambda)$ are the calculated optical absorption in the CuPc:PTCBI active layers for TM and TE polarized incident light, respectively, and $S(\lambda)$ is the AM1.5 solar irradiance spectrum. And the total absorption enhancement is calculated as $(A'_{photon}/A'_{photon\ ref}-1) \cdot 100\%$. The total absorptivity and total absorption enhancement in active layers with the proposed 2D Ag NGs are 0.48 and 141%, respectively, which are much larger than 0.24 and 50% for OPVs with 1D Ag nanograings electrodes at the top interface, or total absorption enhancement of 67% for OPVs with coupled 1D Ag nanogratings at the top and bottom interfaces considering both TM and TE polarizations under AM 1.5 illumination.

Recently, intensive research efforts were performed to achieve compact metamaterial perfect absorbers. Polarization and angle independent perfect absorption has been reported in visible and IR regions based on nanostructured-metal/dielectric/metal structures, which have been applied to enhanced OPV devices with the broadband and wide-angle absorption. However, it is unexplored whether the perfect light absorber (OPV device based on nanostructured-metal/active layers/metal structure) could result in the broadband and angle-insensitive absorption in the active layers, rather than in the lossy metals. Therefore, in order to distinguish the absolute absorption of the active layers from the metal loss, we numerically study the competing absorption mechanism in the active layers and metals of the proposed OPV device that could function as a broadband and wide-angle perfect absorber. The conventional OPV device with ITO electrode cannot efficiently absorb the incident light at small angles (0~10°) due to the ultrathin (20 nm) light-harvesting active layers, as shown in FIG. 4A. As the incident angle increases from 30° to 60°, the absorption of the OPV device with ITO electrode becomes stronger and broader because more incident light could be coupled into waveguide (ITO/active layers/metal film) modes. However, the enhanced absorption of the OPV device at large incident angles is mainly attributed to the metal loss rather than the absorption in the active layers, as clearly shown in FIGS. 4B and 4C. On the other hand, in FIG. 4D, the OPV device with 2D Ag NGs (i.e. P=300 nm, w=70 nm and $t_1$=30 nm) could be considered as a perfect light absorber with high absorption over the entire spectrum (400 nm<λ<800 nm) up to 60° of the incident angle, which shows an absorption peak over 98% at the wavelength of 500 nm. Although the metal loss is increased as the incident angle becomes larger (FIG. 4F), the absorption in the active layers, as shown in FIG. 4E, is still largely enhanced compared to that with the ITO electrode in FIG. 4B. The optimized double-layered structure (2D Ag NGs/active layers/Ag film) played an important role to enhance the absorption in the active layers over a wide range of incident angles, in which the total photon absorptivity and its enhancement were obtained as much as 0.152 and 30.6%, respectively, under 60° light incidence.

According to another aspect of the invention, a solar cell 200 is provided having two spatially separated (i.e. vertically spaced apart) one-dimensional (1D) nanogratings. Compared with organic photovoltaics (OPVs) with 1D Ag nanogratings, the optical absorption in the organic active layers of OPVs with 2D Ag nanogrids (NGs) described herein and above is much stronger and broader due to the polarization-independent excitation of SPRs (surface plasmon resonances), as shown in FIGS. 1C and 1D. However, for each specific polarization (e.g., electric fields along x or y axis), FIGS. 5C(ii) and 5C(iv) (upper right/lower right) clearly show that SPRs are not excited in the central part of 2D Ag NGs. In other words, the inventors discovered that the central part of 2D Ag NGs did not contribute to the optical absorption enhancement in the active layers. In order to even further improve the optical absorption in the active layers, it is desirable to excite SPRs over the whole NG area, including the central part, under different polarizations for enhancing the power conversion efficiency (PCE) of OPV solar cells.

The inventors have discovered that spatially separating a pair of nanogratings within the OPV solar cell package advantageously improves optical absorption in the central region or part of the active layers. This in turn translated into increased power conversion efficiency (PCE).

Figure 5A:
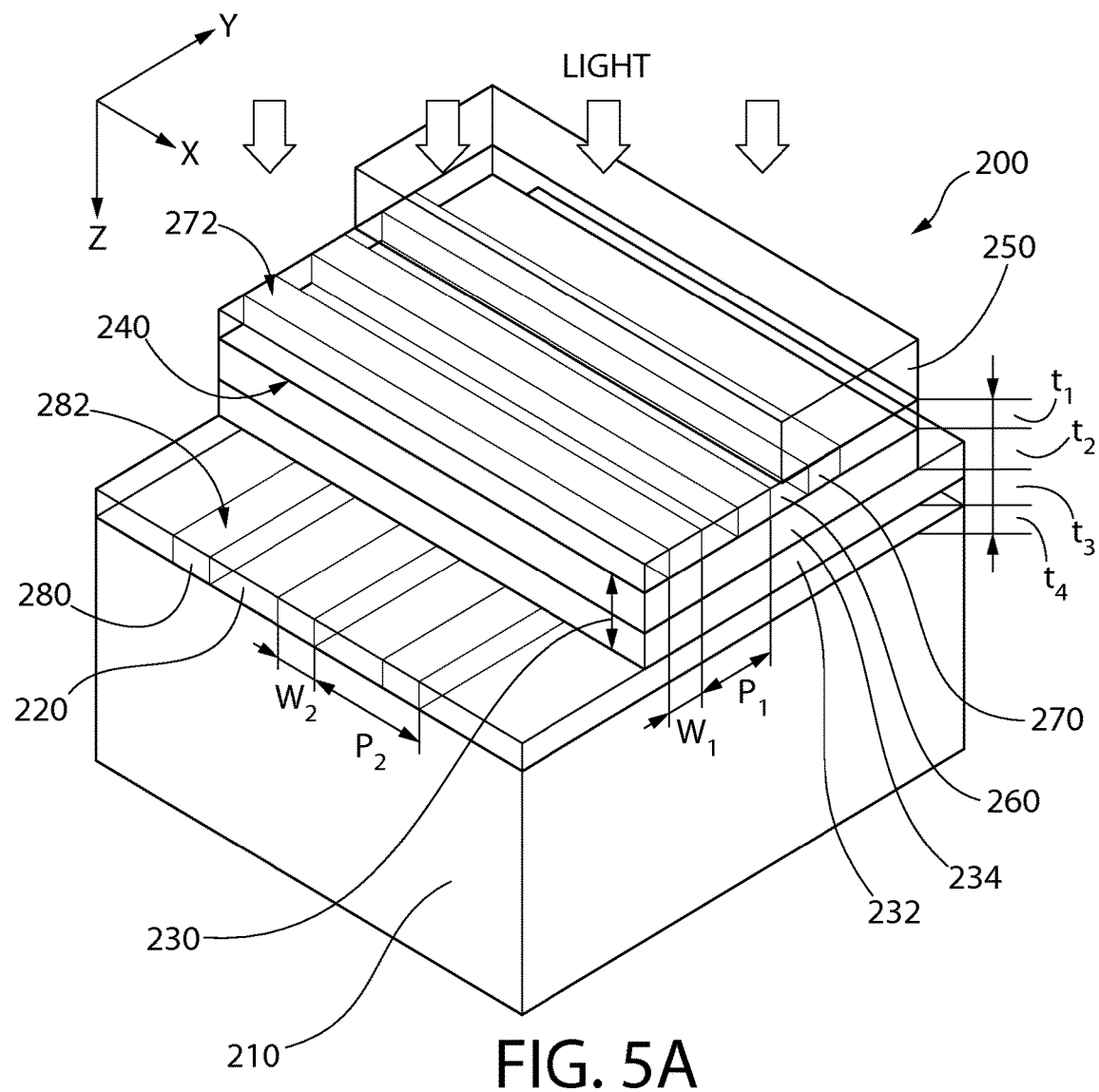
FIG. 5A is a transverse cross sectional view of a thin film small molecular organic photovoltaic (OPV) device or solar cell according to the present disclosure having a two spatially separated perpendicular 1D plasmonic nanogratings.

FIG. 5A illustrates a solar cell 200 according to the present disclosure having spatially separated 1D nanogratings in lieu of the 2D nanogrid shown in FIG. 1A. With that exception, the construction of solar cell 200 is essentially similar to solar cell 100 described above and shown in FIG. 1A and will not be repeated in detail for the sake of brevity.

Solar cell 200 includes a bottom electrode layer 210, an electron transport layer 220 disposed thereon that enhances transport of electrons to the bottom electrode layer, an organic active bilayer 230 disposed thereon comprising an acceptor layer 232 and a donor layer 234, a top plasmonic transparent conducting electrode (TCE) layer 240 disposed thereon, and a transparent top substrate 250 disposed thereon. The TCE layer 240 includes a first ultrathin 1D top nanograting 270 embedded in transparent conductive material 260, such as transparent conductive polymer PEDOT:PSS described above. Electron transport layer 220 (e.g. BCP) includes a second ultrathin 1D bottom nanograting 280 embedded therein. Top and bottom nanogratings 270 and 280 are respectively disposed on opposite sides above and below the active bilayer 230 and spatially separated from each other by a vertical distance in the solar cell package. Each nanograting 270, 280 is preferably formed of a suitable conductive metal having a thickness and other geometric parameters selected to excite surface plasmonic resonances at the interface between each nanograting and active bilayer 230 for increasing absorption in the active bilayer. In one non-limiting example, silver (Ag) may be used. Other suitable conductive metallic materials may be used for nanogrids and nanogratings including for example gold.

Bottom nanograting 280, embedded in the BCP electron transport layer 220 of the same thickness, may be formed directly adjacent to and contacts bottom electrode layer 210 in the non-limiting embodiment shown. In one embodiment, the bottom electrode layer 210 and bottom nanograting may comprised a single monolithic conductive metallic structure formed by a single material deposition step, as further described herein.

With continuing reference to FIG. 5A, each of top and bottom nanogratings 270, 280 may be comprised of a plurality of horizontally spaced apart and elongated metallic linear elements 272, 282 (e.g. nanowires). In one embodiment, the linear elements 272, 282 in each nanograting 270, 280 may be spaced equidistant and arranged substantially parallel to each other in the same nanograting. As indicated in FIG. 5A, the linear elements 272 in top nanograting 270 may be spaced apart at a pitch or period $P_1$ and have a linewidth $w_1$ with a thickness $t_1$. The linear elements 282 in bottom nanograting 280 may be spaced apart at a pitch or period $P_2$ and have a linewidth $W_2$ with a thickness $t_4$. In other possible embodiments, spacing other than equidistant may be used between linear elements 272 and 282 in each nanograting 270 and 280, respectively.

The length or longitudinal extent of each linear element 272, 282 in their respective nanograting array define a horizontal orientation and axial direction (i.e. perpendicular to the vertical thickness or height of the solar cell). The top and bottom nanogratings 270, 280 may have different orientations with the linear elements 272, 282 in each nanograting being arranged at an angle in relation to the linear elements in the other nanograting. In one embodiment, the top and bottom nanogratings 270 and 280 may be oriented at 90 degrees (perpendicular) to each other. In essence, such an arrangement may be considered to form a spatially separated nanogrid comprised of top and bottom nanogratings 270, 280. In other embodiments, the top and bottom nanogratings 270 and 280 may be oriented at different or oblique angles in relation to each other.

Example 2 (Spatially Separated 1D Plasmonic Nanogratings)

Reference is made to FIG. 5A which illustrates the exemplary solar cell 200 with OPV structure having double spatially separated perpendicular 1D Ag nanogratings 270, 280. The 15 nm-thick ($t_1$) top 1D Ag nanograting (line-width $w_1$ and period $P_1$) is fabricated on a glass substrate and embedded in the PEDOT:PSS film of the same thickness. Next to this layer is the organic active light-harvesting layers, which consists of a 10 nm-thick CuPc layer and 10 nm-thick PTCBI layer. This is followed by a 60 nm-thick ($t_4$) bottom 1D Ag nanograting (linewidth w2 and period $P_2$, the grating direction is perpendicular to the top 1D Ag nanogratings) and BCP layer of the same thickness that transports electrons to the 80 nm-thick bottom Ag electrode. The bottom 1D nanogratings is embedded in the BCP layer. The device is illuminated from the glass side (i.e. incident light). 3D-FDTD methods are applied to model the optical absorption in the active layers.

Figure 5B:
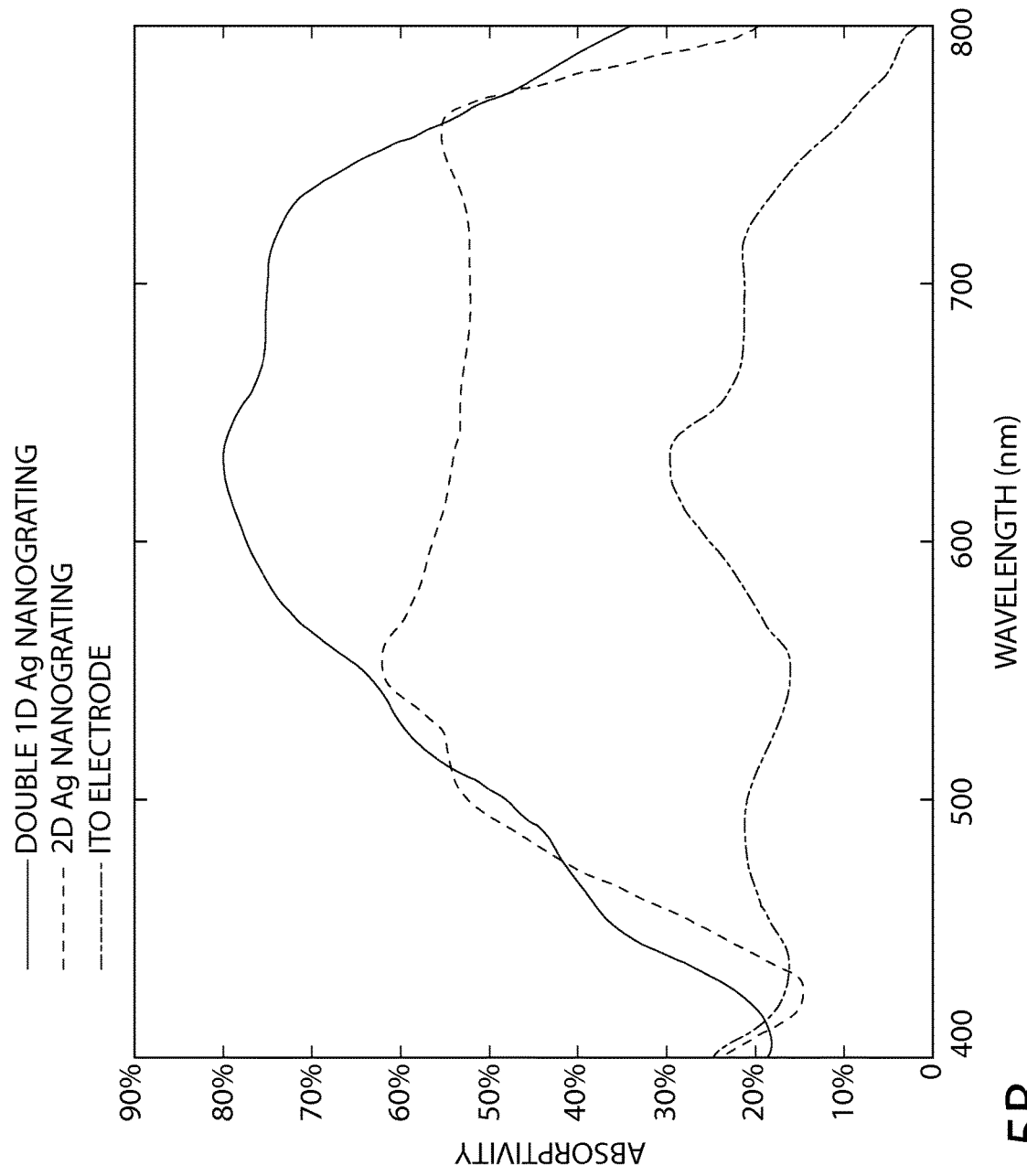
FIG. 5B shows the calculated optical absorption spectra of the OPV solar cell of FIG. 5A with two perpendicular nanogratings compared with a 2D Ag nanogrids (w=70 nm, P=300 nm) and 100 nm thick ITO electrodes under the unpolarized incident light.

FIG. 5B shows the calculated optical absorption spectra $A(\lambda)$ in the active layers of molecular OPVs with the double or dual spatially separated perpendicular 1D Ag nanogratings ($w_1=w_2=70$ nm, $P_1=P_2=300$ nm, solid curve), 2D Ag NGs (w=70 nm, P=300 nm, dashed curve), and 100 nm-thick ITO electrodes (dash-dot-dash curve) under the unpolarized incident light. It clearly shows that the optical absorption spectrum $A(\lambda)$ in the active layers with double perpendicular 1D Ag nanogratings is much stronger than that with 2D Ag NGs in the spectral region from 550 nm to 750 nm.

Figure 5C:
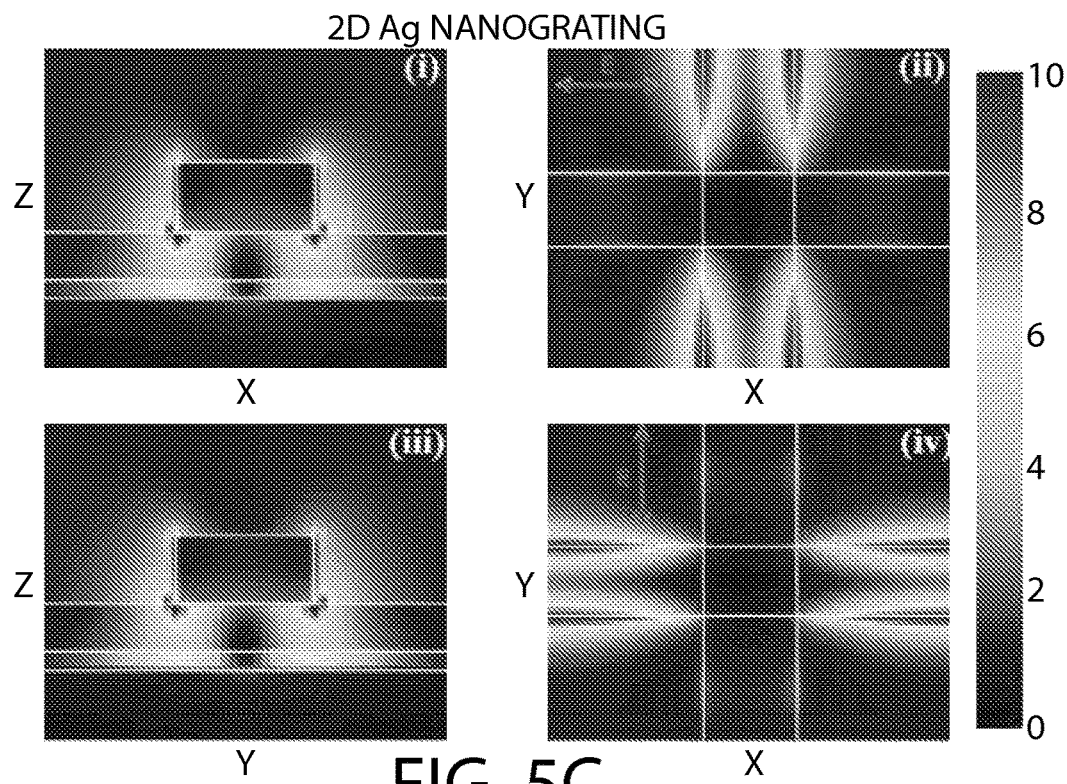
FIGS. 5C and 5D plot different (x-z, x-y, and y-z) cross-sections of electric field distributions for OPV solar cells with a 2D Ag nanogrids and double perpendicular 1D Ag nanograting electrodes, respectively, under different polarizations (electric fields along x and y axis, respectively) at the wavelength $\lambda=600$ nm.
Figure 5D:
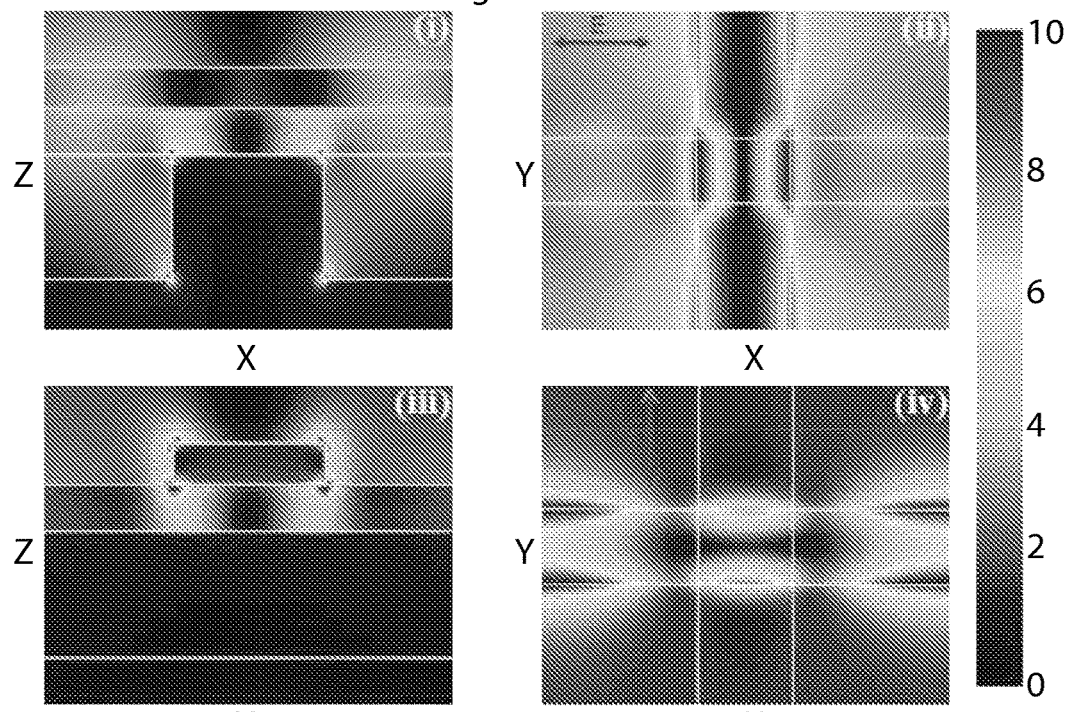

In order to clarify the underlying physical mechanisms, FIGS. 5C and 5D plot different (x-z, x-y, and y-z) cross-sections of electric field distributions for OPVs with 2D Ag nanograting electrodes and double perpendicular 1D Ag nanograting electrodes, respectively, under different polarizations (electric fields along x and y axis, respectively) at the wavelength $\lambda=600$ nm. The x-z and y-z cross-sections of electric fields in FIGS. 5C(i) and 5C(iii) are identical, due to the polarization-independent excitation of SPRs (surface plasmon resonances) in ultra-thin 2D Ag NGs. In addition, the x-y cross-sections of electric fields in FIGS. 5C(ii) and 5C(iv) show that the electromagnetic fields are not enhanced in the central part of 2D Ag NGs under both polarizations. On the other hand, FIGS. 5D(i) and 5D(iii) demonstrate that enhanced electric fields are positioned at the bottom and top 1D Ag nanogratings, respectively. The incident light (with electric fields along x-axis, FIGS. 5D(i) and 5D(ii)) transmits through the top ultra-thin 1D Ag nanogratings (along x-axis) with high transmission (>95%), and then arrives at the bottom 1D Ag nanogratings (along y-axis), resulting in the excitation of SPRs. For the incident light with electric fields along y-axis, as shown in FIGS. 5D(iii) and 5D(iv), SPRs can be excited in the top ultra-thin 1D Ag nanogratings (along x-axis). Due to the separately excited SPRs in the bottom and top 1D Ag nanogratings, the electric fields are enhanced over the whole nanograting area, including the central part under both polarizations, as shown in FIGS. 5D(ii) and 5D(iv). Therefore, the double perpendicular 1D Ag nanograting electrodes advantageously provide much stronger optical absorption enhancement in the active layers.

Figure 6A:
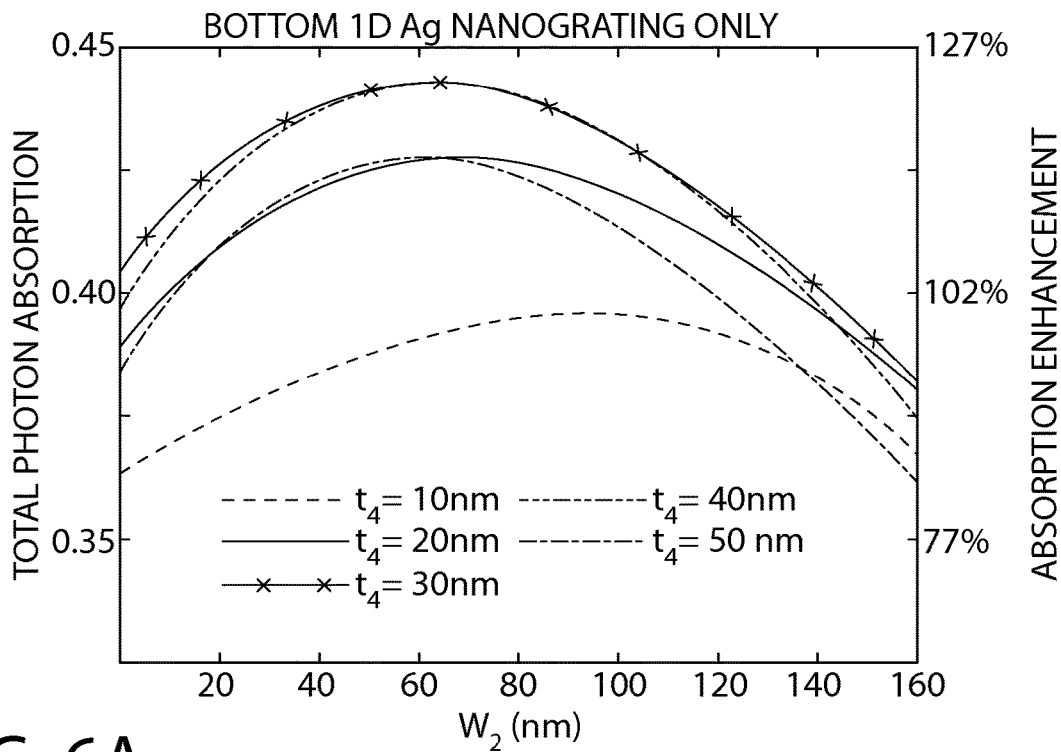
FIGS. 6A and 6B show the total photon absorption and total photon absorption enhancement in OPV solar cells with a bottom 1D Ag nanograting and top ITO electrodes, as a function of thickness $t_4$ and line-width $w_2$ of bottom 1D Ag NGs, when the period $P_2$ is fixed at 300 nm; or as a function of period $P_2$, when the thickness and line-width are fixed at $t_4=60$ nm and $w_2=70$ nm, respectively.
Figure 6B:
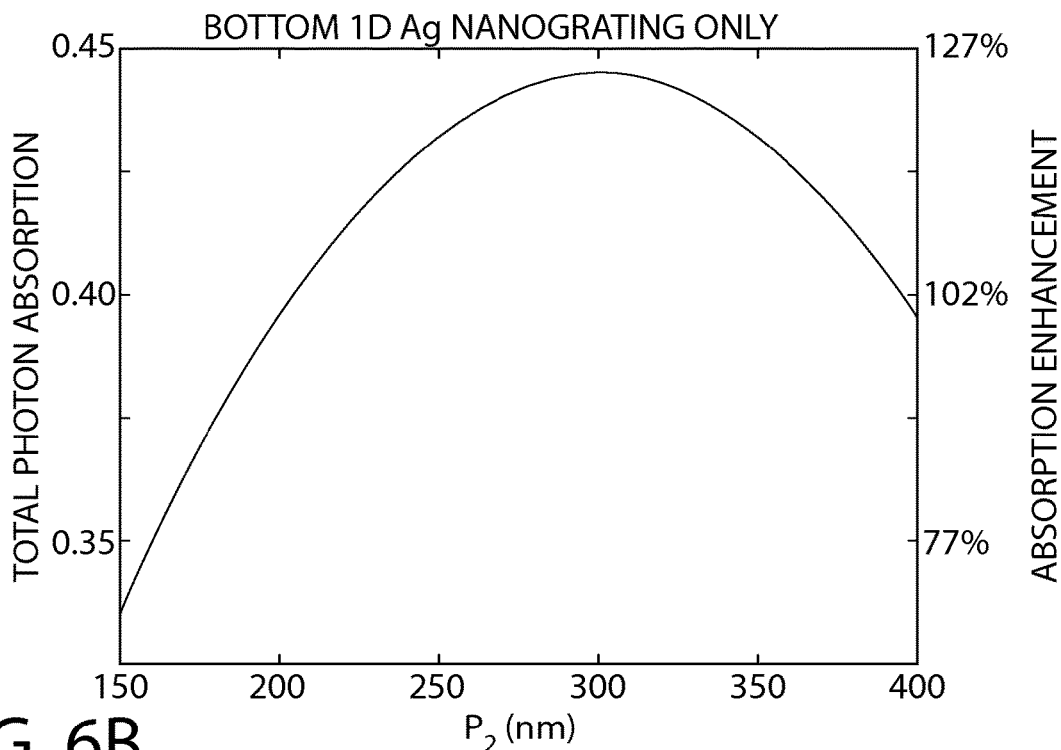

In order to maximize the overall optical absorption in the active layers of OPVs, the geometric parameters of double perpendicular 1D Ag nanograting electrodes need to be optimized. Due to the complex scheme, we first examine the geometric parameters of the bottom 1D Ag nanogratings. FIGS. 6A and 6B give the total photon absorption $A_{photon}$ and total photon absorption enhancement ($A_{photon}/A_{photon-ref}-1$)·100% in OPVs with bottom 1D Ag NGTs and top ITO electrodes, as a function of thickness $t_4$ and line-width $w_2$ of bottom 1D Ag NGTs, when the period $P_2$ is fixed at 300 nm; or as a function of period $P_2$, when the thickness and linewidth are fixed at $t_4=60$ nm and $w_2=70$ nm, respectively. In FIG. 6A, the total photon absorption is increased as the thickness $t_4$ changes from 30 nm to 60 nm, and line-width $w_2$ from 20 nm to 70 nm, respectively. And the total photon absorption reaches a maximum value when the thickness and line-width are fixed at $t_4=60$ nm and $w_2=70$ nm, respectively. In addition, FIG. 6B shows the total photon absorption $A_{photon}$ and its enhancement as a function of the period $P_2$ of bottom 1D Ag NGTs when the thickness and line-width are fixed at $t_4=60$ nm and $w_2=70$ nm, respectively. The maximum total photon absorption occurs when the period is 300 nm.

Figure 6C:
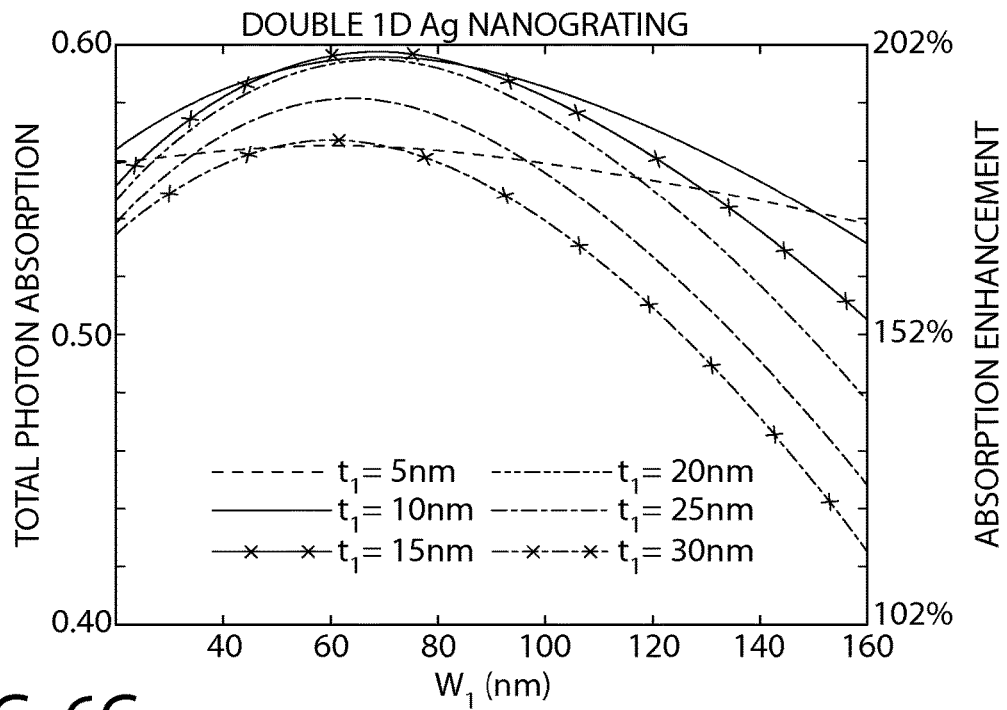
FIGS. 6C and 6D show OPV solar cells with double perpendicular 1D Ag nanogratings (bottom 1D Ag nanograting with the optimized parameters $t_4=60$ nm and $w_2=70$ nm), as a function of (FIG. 6C) thickness $t_1$ and line-width $w_1$ of top 1D Ag nanograting, when the period is fixed at 300 nm, or (FIG. 6D) period $P_1$ (or $P_2$), when the thickness and line-width are $t_1=15$ nm $w_1=70$ nm, respectively.
Figure 6D:
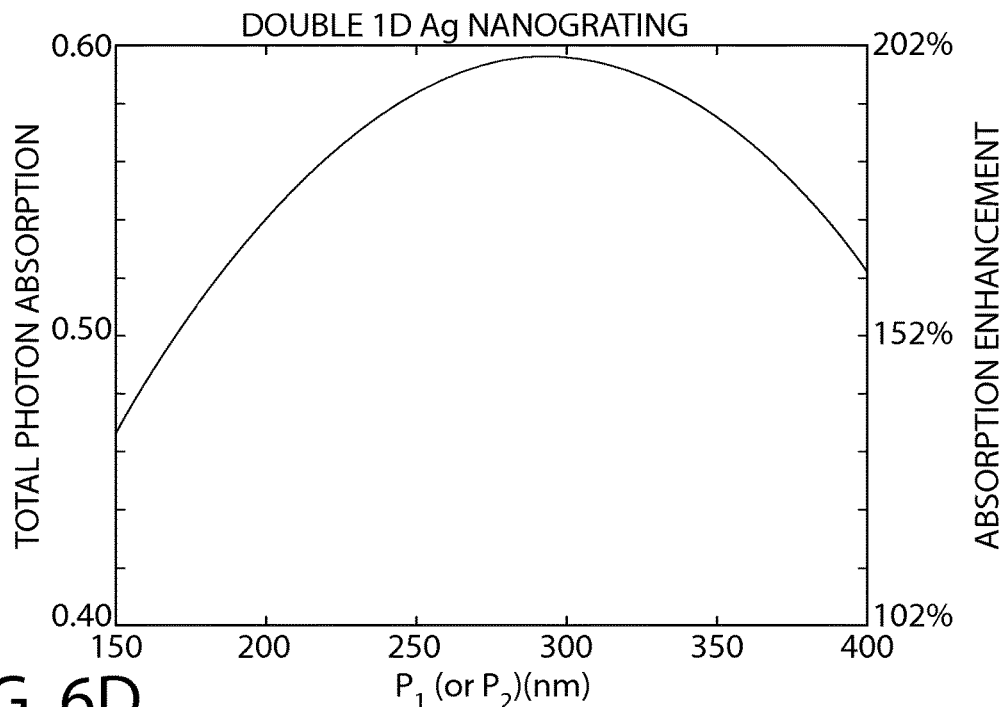

Next, the total photon absorption $A_{photon}$ and its enhancement are calculated in OPVs with double perpendicular 1D Ag nanogratings (the bottom 1D Ag nanogratings with the optimized parameters $t_4=60$ nm and $w_2=70$ nm), as a function of thickness $t_1$ and line-width $w_1$ of top 1D Ag nanogratings, when the period is fixed at 300 nm; or as a function of period $P_1$ (or $P_2$), when the thickness and line-width are $t_1=15$ nm $w_1=70$ nm, respectively, as shown in FIGS. 6C and 6D. In FIG. 6C, the total photon absorption is increased as the thickness $t_1$ increases from 5 nm to 15 nm, and line-width $w_1$ from 30 nm to 70 nm, respectively. As the thickness $t_1$ or line-width $w_1$ increase further, $A_{photon}$ becomes smaller, since the thicker or wider Ag nanogratings have lower optical transmission in this spectral region. And the total photon absorption reaches a maximum value of 0.595 ($A_{photon}$ enhancement 200%) when the thickness and line-width of top 1D Ag nanogratings are $t_1=15$ nm and $w_1=70$ nm, respectively. In addition, FIG. 6D shows $A_{photon}$ and its enhancement as a function of the period $P_1$ (or $P_2$) of 1D Ag nanogratings when the thickness and line-width of top and bottom 1D Ag nanogratings are fixed at optimized parameters. The maximum $A_{photon}$ occurs when the period is 300 nm. $A_{photon}$ is greatly enhanced for a large range of period or line-width of 1D Ag nanogratings, which is encouraging since it provides a good tolerance for the fabrication of the Ag nanogratings. It is worth noting that the $A_{photon}$ and its enhancement with the optimized double perpendicular 1D Ag nanogratings, 0.595 and 200%, respectively, are much greater than that of previous designs, including molecular OPVs with ultra-thin 2D Ag NGs (0.495 and 150%). Although the OPV device with double perpendicular 1D Ag nanogratings may be more complex in construction than that with single-layer ultra-thin 2D Ag NGs, an improvement in absorption in the active bilayer 230 may be realized as disclosed above.

Based on the foregoing analysis and results, the bottom nanograting 280 preferably has a thickness $t_4$ which is larger than the thickness $t_1$ of the top nanograting 280. It should be noted for clarification that all thicknesses referred to herein are vertical thicknesses taken through a transverse cross section of the layer being described.

For optimizing light absorption in the active bilayer 230, top nanograting 270 may have a thickness ($t_1$) of less than 50 nm, and more preferably in some embodiments in a range from and including 5 nm to 30 nm, and most preferably from and including 10 nm to 20 nm based on the results depicted in FIG. 3C described above. Top nanograting 270 may have a linewidth ($w_1$) in a range from and including 50 nm to 100 nm, and more preferably in some embodiments in a range from and including 60 nm to 80 nm based on the results depicted in FIG. 3C.

Bottom nanograting 280 may have a thickness ($t_4$) in the range from and including 30 nm to 70 nm. Bottom nanograting may have a linewidth ($w_2$) in a range from and including 40 nm to 120 nm, and more preferably in some embodiments in a range from and including 60 nm to 80 nm based on the results depicted in FIG. 3A. Total photon absorption is optimized and maximized at a thickness ($t_4$) of 60 nm, a linewidth ($w_2$) of 70 nm, and a period $P_2$ of 300 nm (between linear elements 282), as shown.

In view of the results shown in FIGS. 3A-D, when the 1D bottom nanograting 280 has a thickness $t_4$=60 nm and linewidth $w_2$=70 nm at optimized conditions, the total photon absorption of the active bilayer 230 reaches a maximum value of 0.595 when the thickness and linewidth of the top nanograting 270 are $t_1$=15 nm and $w_1$=70 nm, respectively. The maximum total photon absorption $A_{photon}$ in the active bilayer 230 occurs when the period is 300 nm. In some embodiments, therefore, the linewidths $w_1$ of the top nanograting 270 and $w_2$ of the bottom nanograting 280 may be the same.

Top and bottom nanogratings 270, 280 may be formed in a similar manner to nanogrid 170 described herein, or in a different manner. The top 1D nanograting 270 may be formed on a glass substrate 250 as solid thin layer and then patterned by any suitable means to form linear elements 272. Top nanograting 270 is then embedded in an ultrathin spin-coated PEDOT:PSS film of transparent conductive material 260 having substantially the same thickness.

The bottom nanograting 280 may be fabricated in a different manner from the top nanograting 270. In one embodiment, the process may include first patterning the 1D nanograting in BCP layer (i.e. forming open troughs—negative impressions or patterns), and then deposit Ag into them and on the BCP layer (to essentially simultaneously form 1D Ag nanogratings and the bottom Ag electrode in a single material deposition step). This is the last step of fabricating the thin film OPV solar cell 100 package in one embodiment.

In an exemplary non-limiting method or process for fabricating the OPV solar cell 200, the fabrication order may be: 1. pattern/form 1D Ag top nanograting on the glass or other top transparent substrate; 2. spin-coat PEDOT:PSS thereon; 3. deposit CuPc:PTCBI thereon; 4. Deposit BCP thereon; 5. pattern 1D bottom nanograting (i.e. negative pattern or troughs) in BCP layer; and 6. deposit bottom Ag layer to form both the 1D Ag bottom nanograting and the bottom Ag electrode which may comprise a single integral monolithic metallic layer formed in a single deposition step.

It will be appreciated that the OPV solar cell 100 with a single ultrathin 2D metallic nanogrid 170 in lieu of double spaced apart perpendicular nanogratings 270, 280 may be formed in a similar manner to OPV solar cell 200 described above. The differences in the processes being (1) a 2D nanogrid is patterned/formed on the top transparent substrate in lieu of the 1D top nanograting for OPV solar cell 100, and (2) no 1D bottom nanograting is formed in/on the BCP layer for the OPV solar cell 100—the bottom electrode is formed directly on an unpatterned BCP layer. Variations of the foregoing fabrication processes are possible.

While the foregoing description and drawings represent exemplary embodiments of the present disclosure, it will be understood that various additions, modifications and substitutions may be made therein without departing from the spirit and scope and range of equivalents of the accompanying claims. In particular, it will be clear to those skilled in the art that the present invention may be embodied in other forms, structures, arrangements, proportions, sizes, and with other elements, materials, and components, without departing from the spirit or essential characteristics thereof. In addition, numerous variations in the methods/processes described herein may be made within the scope of the present disclosure. One skilled in the art will further appreciate that the embodiments may be used with many modifications of structure, arrangement, proportions, sizes, materials, and components and otherwise, used in the practice of the disclosure, which are particularly adapted to specific environments and operative requirements without departing from the principles described herein. The presently disclosed embodiments are therefore to be considered in all respects as illustrative and not restrictive. The appended claims should be construed broadly, to include other variants and embodiments of the disclosure, which may be made by those skilled in the art without departing from the scope and range of equivalents.

What is claimed is:

1. A thin film organic photovoltaic solar cell comprising:
a bottom electrode layer;
an electron transport layer disposed thereon and including a one-dimensional metallic bottom nanograting embedded therein;
an organic active bilayer disposed thereon comprising an acceptor layer and a donor layer, the acceptor and donor layers being formed of electrically conductive organic polymers selected to form a heterojunction at an interface between the acceptor and donor layers; and
a transparent top conducting electrode layer disposed thereon, the top electrode layer comprising a transparent conductive material and a one-dimensional metallic top nanograting embedded therein;
wherein the nanogratings have thicknesses selected to excite surface plasmonic resonances of all light polarizations at an interface between the nanogratings and active bilayer from incident light on the transparent conducting electrode layer for increasing photon absorption in the active bilayer; and
wherein the top nanograting is arranged in a different orientation than the bottom nanograting forming a composite nanograting structure possessing two-dimensional symmetry in top plane view having polarization-independent optical absorption.

2. The solar cell of claim 1 wherein the top nanograting is oriented perpendicular to the bottom nanograting.

3. The solar cell of claim 1, wherein the acceptor layer of the active layer is 3,4,9,10-perylenetetracarboxylic bis-benzimidazole and the donor layer is copper pthalocyanine, and wherein the total photon absorptivity of the active bilayer is at least 0.595 in a wavelength region between 400 nm and 800 nm.

4. The solar cell of claim 1, wherein the top nanograting has a thickness less than 50 nm.

5. The solar cell of claim 1, wherein the top nanograting has a linewidth in a range from and including 60 nm to 80 nm.

6. The solar cell of claim 5, wherein the bottom nanograting has a thickness in the range from and including 50 nm to 70 nm.

7. The solar cell of claim 1, wherein the bottom nanograting and the top nanograting have the same thickness.

8. The solar cell of claim 1, wherein linear elements of the top and bottom nanogratings are spaced apart at a same period.

9. The solar cell of claim 1, wherein the total photon absorption of the solar cell is maximized when:
the top nanograting has a thickness of 15 nm and a linewidth 70 nm; and
the bottom nanograting has a thickness of 60 nm and a linewidth of 70 nm.

10. A thin film organic photovoltaic device comprising:
a bottom electrode layer;
an electron transport layer disposed thereon and including a one-dimensional metallic bottom nanograting embedded therein, the bottom nanograting formed of a first array of parallel first linear elements;
an organic active bilayer disposed thereon comprising an acceptor layer and a donor layer, the acceptor and donor layers being formed of electrically conductive organic polymers selected to form a heterojunction at an interface between the acceptor and donor layers; and
a transparent top conducting electrode layer disposed thereon, the top electrode layer comprising a transparent conductive material and a one-dimensional metallic top nanograting embedded therein, the top nanograting formed of a second array of parallel second linear elements oriented perpendicular to the first linear elements of the first array forming a composite nanograting structure with two-dimensional symmetry in top plane view having polarization-independent optical absorption;
wherein the nanogratings have thicknesses selected to excite surface plasmonic resonances of all light polarizations at an interface between the nanogratings and active bilayer from incident light on the transparent conducting electrode layer for increasing photon absorption in the active bilayer.

* * * * *